United States Patent
Chang et al.

(10) Patent No.: US 10,672,665 B2
(45) Date of Patent: Jun. 2, 2020

(54) FIN FIELD EFFECT TRANSISTOR DEVICE STRUCTURE AND METHOD FOR FORMING THE SAME

(71) Applicant: TAIWAN SEMICONDUCTOR MANUFACTURING CO., LTD., Hsinchu (TW)

(72) Inventors: Shang-Wen Chang, Jhubei (TW); Yi-Hsiung Lin, Zhubei (TW); Yi-Hsun Chiu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/251,642

(22) Filed: Jan. 18, 2019

(65) Prior Publication Data
US 2020/0105603 A1  Apr. 2, 2020

Related U.S. Application Data

(60) Provisional application No. 62/738,241, filed on Sep. 28, 2018.

(51) Int. Cl.
| | |
|---|---|
| H01L 21/8234 | (2006.01) |
| H01L 29/66 | (2006.01) |
| H01L 29/78 | (2006.01) |
| H01L 27/088 | (2006.01) |
| H01L 21/768 | (2006.01) |

(52) U.S. Cl.
CPC ........ *H01L 21/823431* (2013.01); *H01L 21/76876* (2013.01); *H01L 21/823437* (2013.01); *H01L 21/823468* (2013.01); *H01L 21/823481* (2013.01); *H01L 27/0886* (2013.01); *H01L 29/66795* (2013.01); *H01L 29/7851* (2013.01)

(58) Field of Classification Search
CPC ....... H01L 21/823431; H01L 21/76876; H01L 29/7851; H01L 21/823481; H01L 21/823437; H01L 29/66795; H01L 27/0886; H01L 21/823468
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |

(Continued)

*Primary Examiner* — Mohammed R Alam
(74) *Attorney, Agent, or Firm* — Birch, Stewart, Kolasch & Birch, LLP

(57) ABSTRACT

A method for forming a FinFET device structure includes forming a first fin structure and a second fin structure on a substrate. The method also includes depositing a first spacer layer over the first and second fin structures. The method also includes growing a power rail between the bottom portion of the first fin structure and the bottom portion of the second fin structure. The method also includes forming a second spacer layer over the sidewalls of the first spacer layer and over the top surface of the power rail. The method also includes forming a first fin isolation structure over the power rail between the first and second fin structures. The method also includes forming a first contact structure over the first fin structure and a portion of the power rail. The method also includes forming a second contact structure over the second fin structure.

20 Claims, 44 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2012/0119307 A1* | 5/2012 | Li .................... H01L 21/76816 257/410 |
| 2018/0294267 A1* | 10/2018 | Licausi ............... H01L 23/5286 |

\* cited by examiner

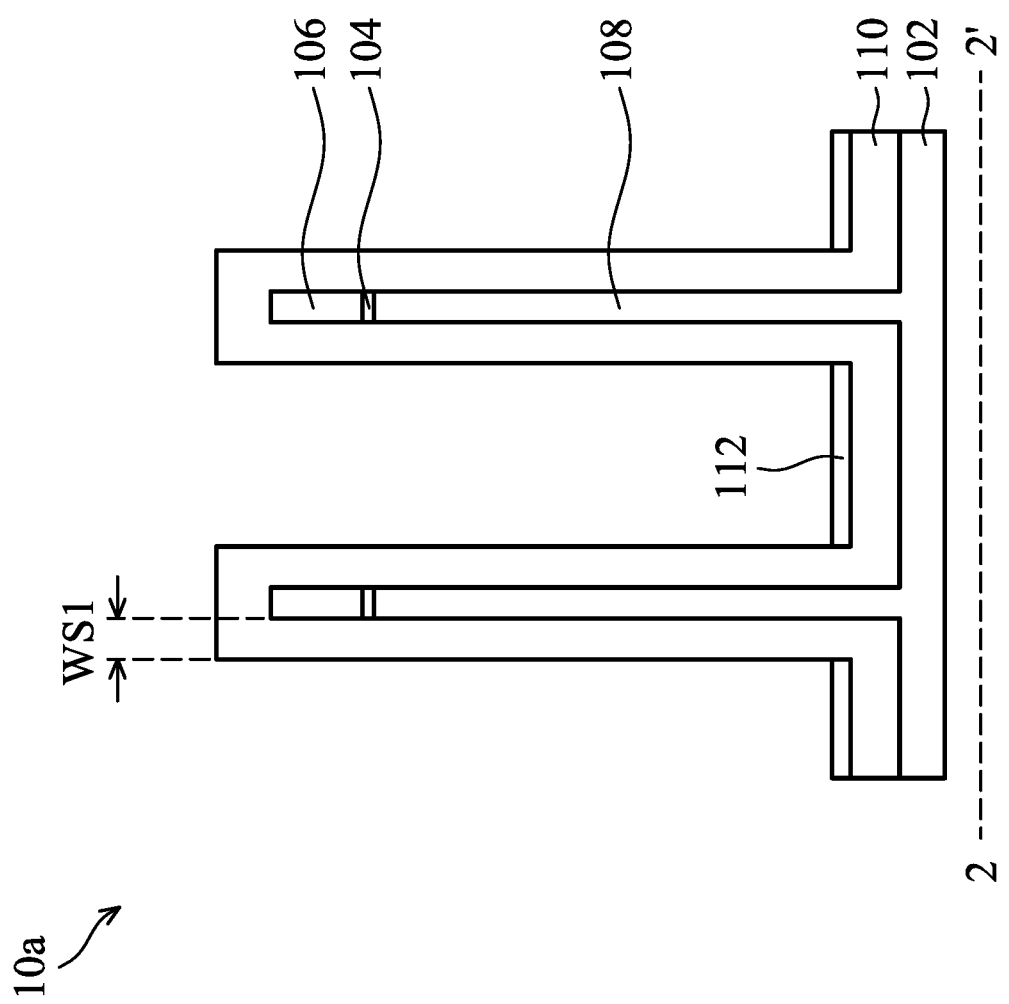

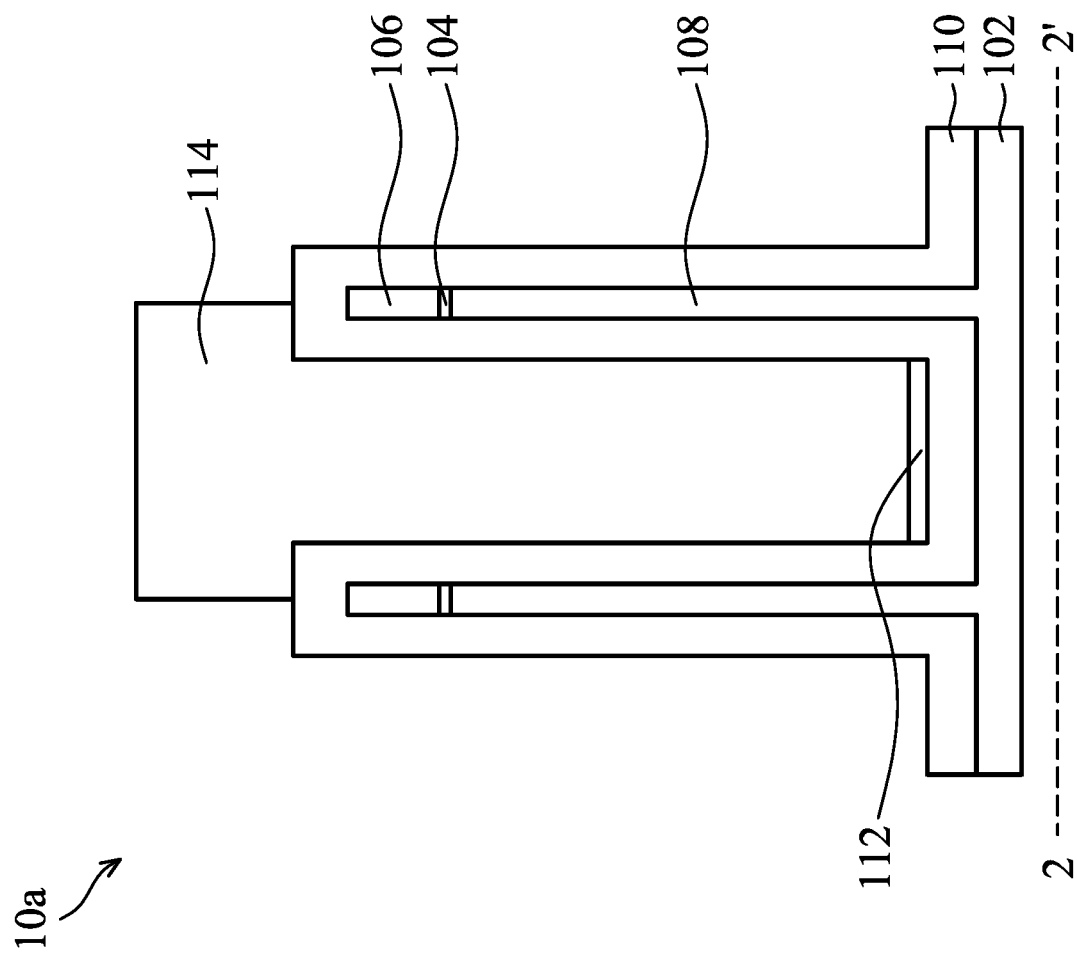

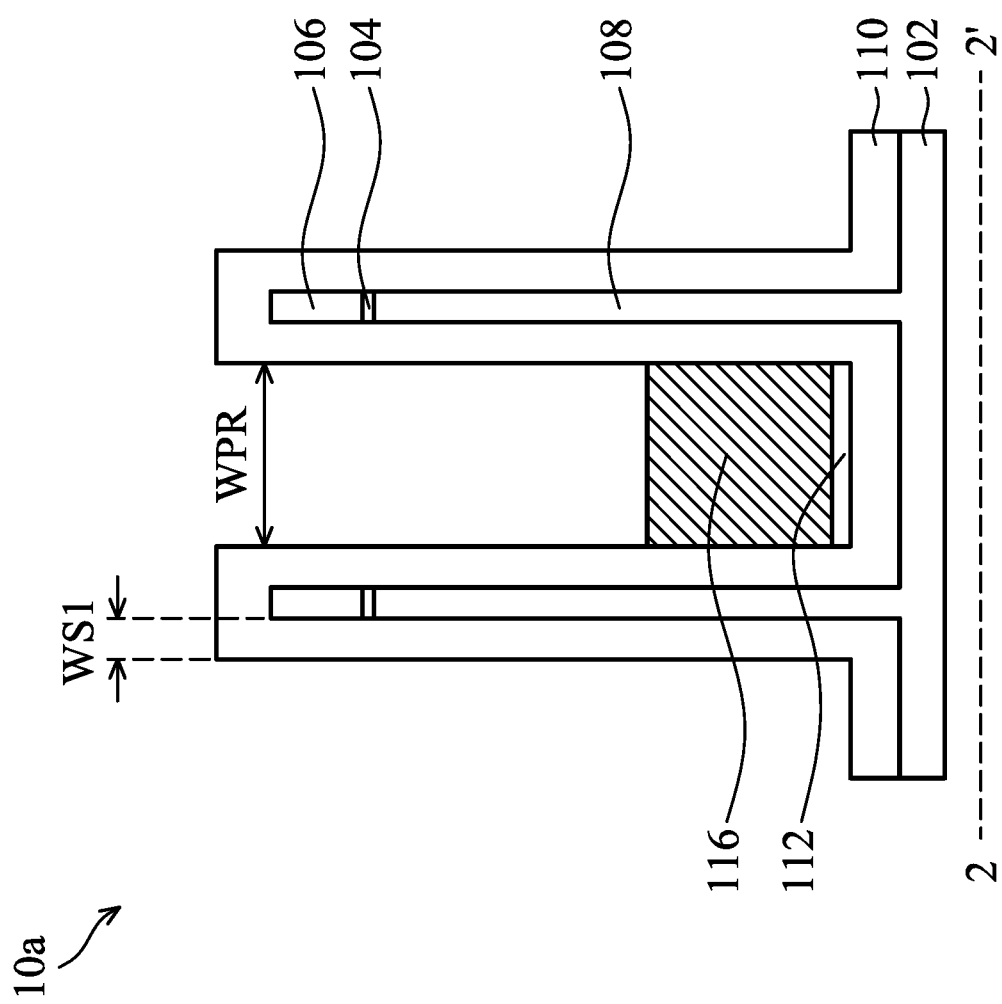

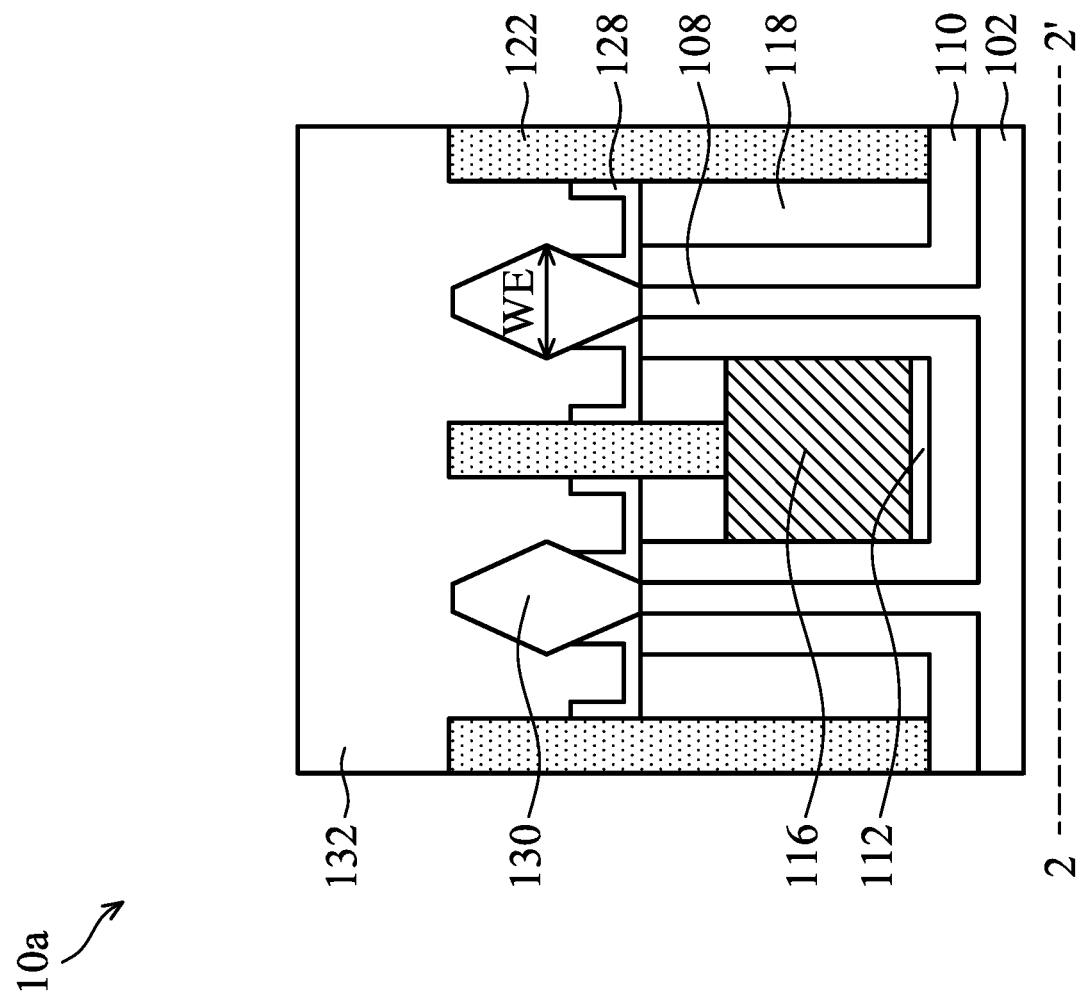

FIN FIELD EFFECT TRANSISTOR DEVICE STRUCTURE AND METHOD FOR FORMING THE SAME

CROSS REFERENCE TO RELATED APPLICATIONS

This application claims the benefit of U.S. Provisional Application No. 62/738,241, filed on Sep. 28, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2L are cross-sectional representations of various stages of forming a FinFET device structure shown in FIGS. 1A-1L, in accordance with some embodiments of the disclosure.

DETAILED DESCRIPTION

Figure 1A:
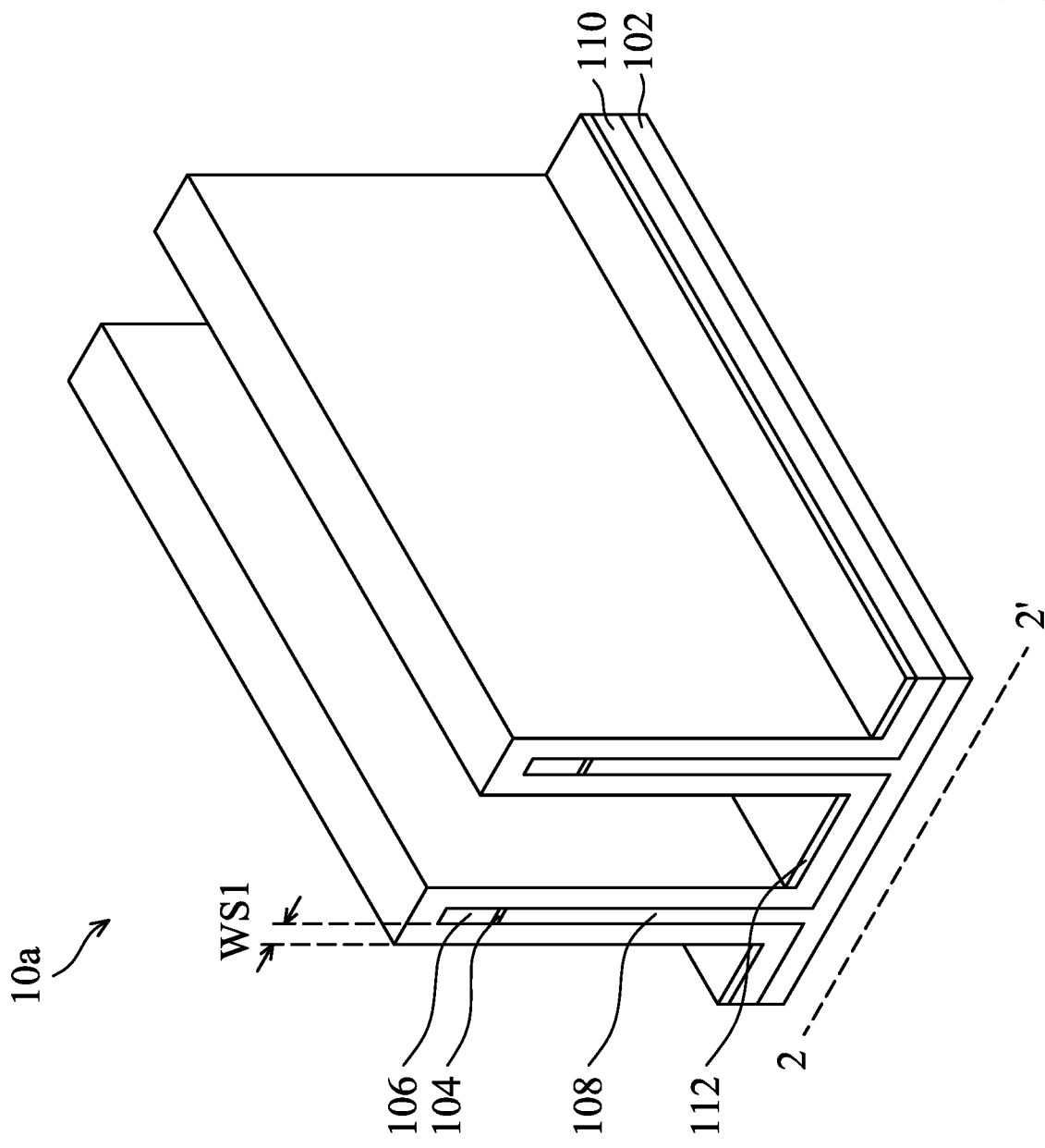
FIGS. 1A-1L are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a fin field effect transistor (FinFET) device structure are provided. The method for forming the FinFET device structure may include forming a power rail on the substrate between the fin structures. A contact structure may be directly formed on the fin structure and the power rail, which may reduce the circuit area. By forming a thinner spacer or double spacers between the power rail and the fin structure, the bottom area of the contact structure connecting the power rail may be enlarged and the resistance may be therefore reduced.

FIGS. 1A-1L are perspective representations of various stages of forming a FinFET device structure 10a, in accordance with some embodiments of the disclosure. FIGS. 2A-2L are cross-sectional representations of various stages of forming a FinFET device structure 10a shown in FIGS. 1A-1L, in accordance with some embodiments of the disclosure. FIGS. 2A-2L show cross-sectional representations taken along line 2-2' in FIGS. 1A-1L.

A substrate 102 is provided as shown in FIGS. 1A and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. In some embodiments, the substrate 102 may be an N-type substrate. In some embodiments, the substrate 102 may be a P-type substrate.

Next, a pad layer 104 is blanketly formed over the substrate 102, and a hard mask layer 106 is blanketly formed over the pad layer 104 as shown in FIGS. 1A and 2A in accordance with some embodiments. The pad layer 104 may be a buffer layer between the substrate 102 and the hard mask layer 106. In addition, the pad layer 104 may be used as a stop layer when the hard mask layer 106 is removed. The pad layer 104 may be made of silicon oxide. The hard mask layer 106 may be made of silicon oxide, silicon nitride, silicon oxynitride, or another applicable material. The pad layer 104 and the hard mask layer 106 may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer 106 (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer 104 and a patterned hard mask layer 106 may be obtained. Afterwards, the patterned photoresist layer may be removed.

Afterwards, an etching process is performed on the substrate 102 to form a fin structure 108 by using the hard mask layer 106 as a mask as shown in FIGS. 1A and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 108 reaches a predetermined height.

Next, a first spacer 110 is conformally formed over the sidewalls and the top surface of the fin structure 108, the pad layer 104, and the hard mask layer 106 as shown in FIGS. 1A and 2A in accordance with some embodiments. In some embodiments, the first spacer 110 is made of insulating materials such as silicon oxide, silicon nitride, silicon carbide nitride, fluorosilicate glass (FSG), a low-k dielectric material, another suitable dielectric material, or a combination thereof. The first spacer 110 may be deposited by an atomic layer deposition (ALD) process, a chemical vapor deposition (CVD) process, a flowable CVD (FCVD) process, or another applicable process. In some embodiments, the thickness WS1 of the first spacer 110 is in a range from about 5 nm to about 20 nm. If the first spacer 110 is too thick, the space available for a subsequently formed power rail between the fin structures 108 may not be wide enough. If the first spacer 110 is too thin, the insulation between the fin structures 108 and the subsequently formed power rail may not be good enough, and this may lead to reliability issues.

Next, a seed layer 112 is formed over the substrate 102 between the fin structures 108 as shown in FIGS. 1A and 2A in accordance with some embodiments. The seed layer 112 may define the location of the subsequently formed power rail, which may be formed over the seed layer 112. The seed layer 112 may be made of amorphous-silicon, silicon oxide, silicon nitride, silicon oxynitride, other dielectric materials, or a combination thereof. The seed layer 112 may be conformally formed over the first spacer 110 by depositing a seed layer material by a chemical vapor deposition process (such as a high-density plasma chemical vapor deposition (HDPCVD) process, an atmospheric pressure chemical vapor deposition (APCVD) process, a low pressure chemical vapor deposition (LPCVD) process, or a plasma enhanced chemical vapor deposition (PECVD) process), an atomic layer deposition (ALD) process, other applicable techniques, or a combination thereof. After that, an etching process may be performed on the seed layer material and the seed layer 112 may be left over the substrate 102. The etching process may be a dry etching process (e.g., reactive ion etching (RIE), anisotropic plasma etching method), which may be performed using an oxygen-containing gas, a fluorine-containing gas (such as CF4, $SF_6$, $CH_2F_2$, $CHF_3$, and/or $C_2F_6$), a chlorine-containing gas (such as $Cl_2$, $CHCl_3$, $CCl_4$, and/or $BCl_3$), a bromine-containing gas (such as HBr and/or $CHBR_3$), an iodine-containing gas, other suitable gases and/or plasmas, or a combination thereof.

Figure 1B:
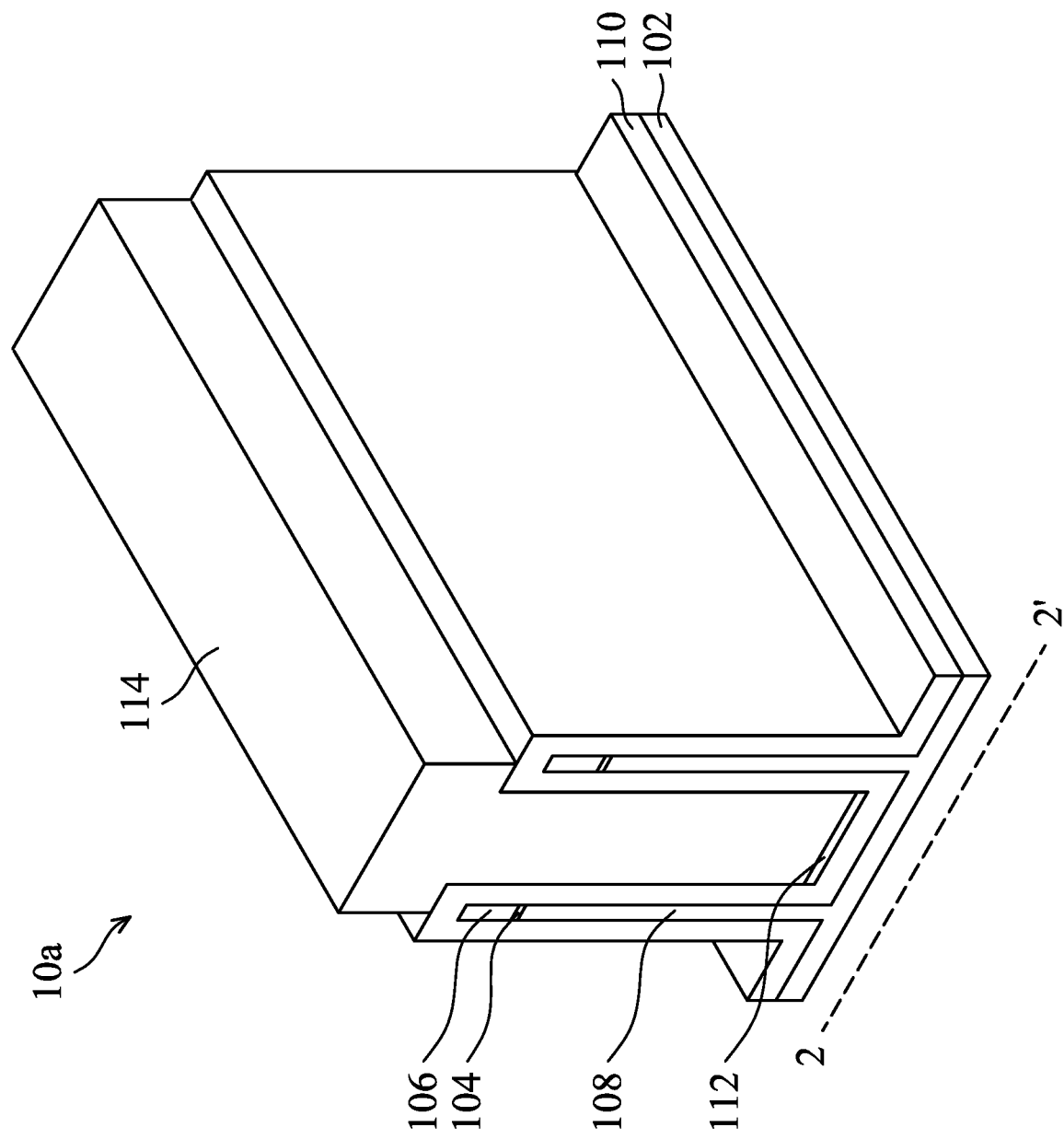

Next, a patterned photoresist 114 is formed over the seed layer 112 as shown in FIGS. 1B and 2B in accordance with some embodiments. An etching process may be performed on the seed layer 112 to remove exposed seed layer material by using a patterned photoresist layer 114 as a mask. The etching process may be a dry etching process or a wet etching process. In some embodiments, the seed layer 112 is etched by a dry etching process. The dry etching process may include using a fluorine-based etchant gas, such as $SF_6$, $C_xF_y$ (where x and y may be positive integers), $NF_3$, or a combination thereof.

Figure 1C:
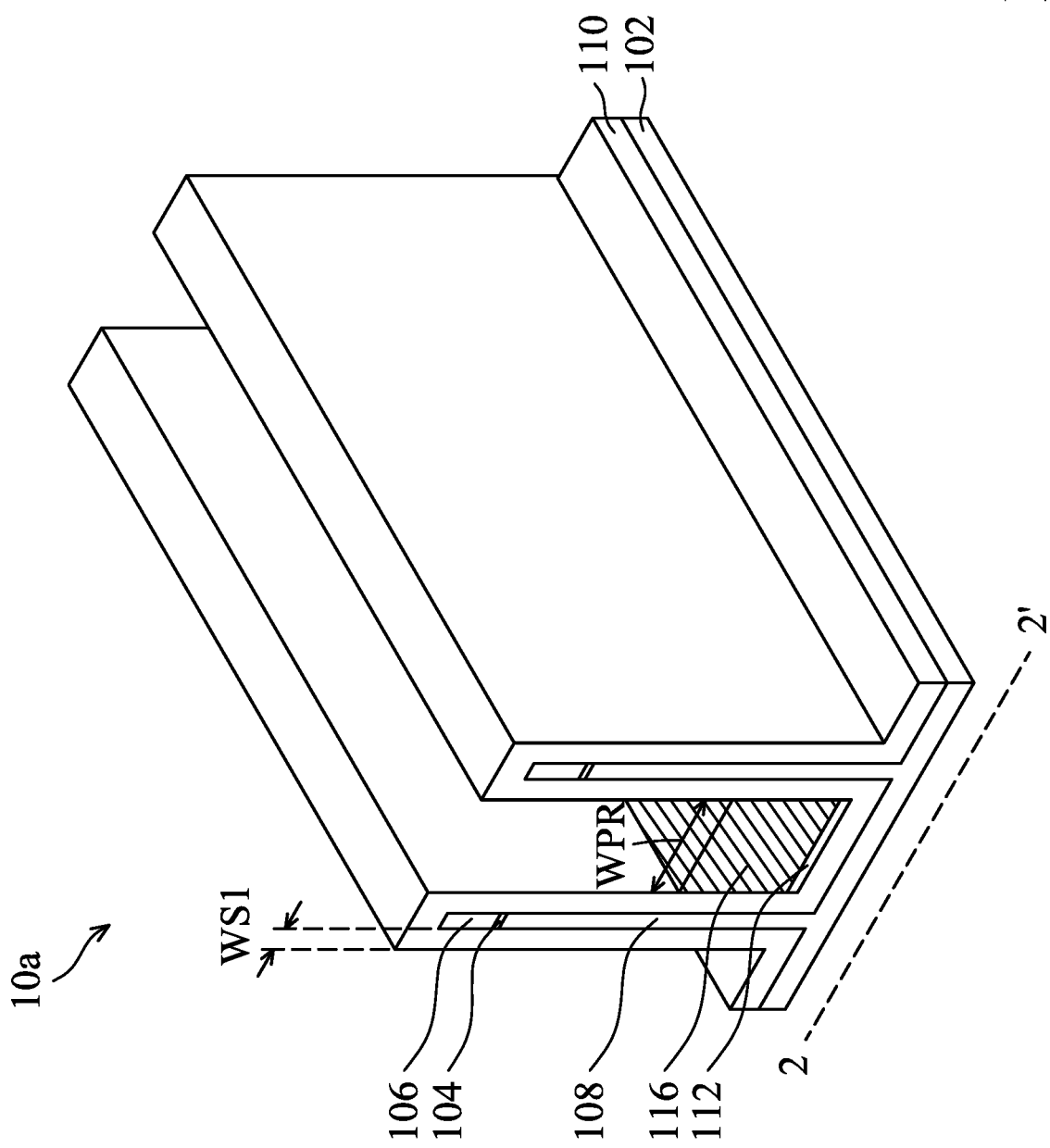

After the photoresist 114 is removed, a power rail 116 is formed over the seed layer 112 as shown in FIGS. 1C and 2C in accordance with some embodiments. In some embodiments, the power rail 116 is formed over the substrate 102 between the fin structures 108. The power rail 116 may have a good lattice match with the seed layer 112. In some embodiments, the width WPR of the power rail 116 is in a range from about 20 nm to about 50 nm. Moreover, the ratio of the width WS1 of the first spacer 110 to the width WPR of the power rail 116 is in a range from about 10% to about 100%. If the width WPR of the power rail 116 is too wide, resulting in a lower ratio, the insulation between the fin structures 108 and the power rail 116 may not be good enough, and this may lead to reliability issues. If the width WPR of the power rail 116 is too narrow, resulting in a higher ratio, there may not be enough of a landing area for the subsequently formed contact structure over the power rail 116.

The power rail 116 may be made of ruthenium, copper, tungsten, aluminum, molybdenum, titanium, tantalum, palladium, platinum, cobalt, nickel, conductive metal oxides, other applicable low-resistance materials, or a combination thereof. The power rail 116 may be formed by a physical vapor deposition process (PVD, e.g., evaporation or sputtering), an atomic layer deposition process (ALD), an electroplating process, other applicable processes, or a combination thereof. In some embodiments, the power rail 116 may be formed by a bottom-up deposition process.

Figure 1D:
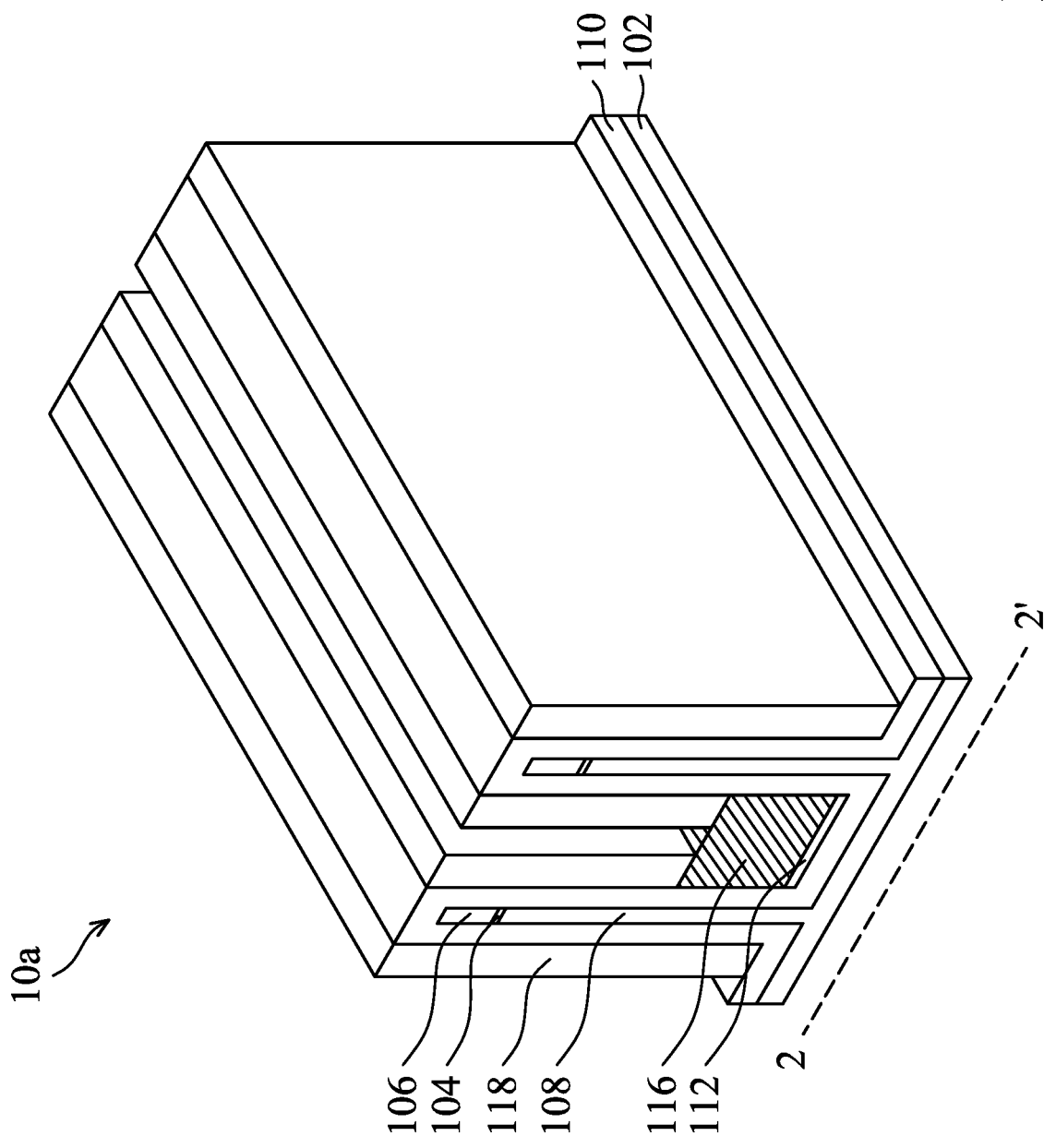
Figure 2D:
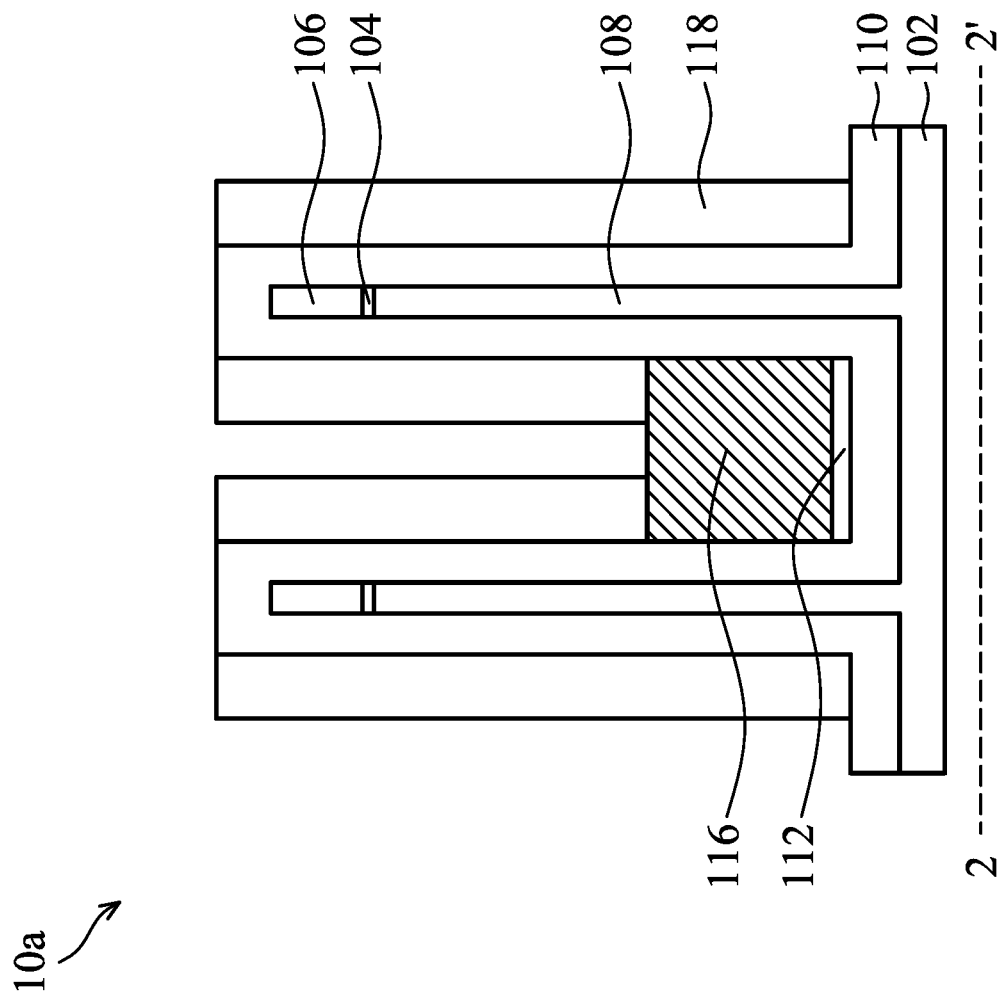

Next, a second spacer 118 is formed over the sidewalls of the first spacer 110 and over the top surface of the power rail 116 as shown in FIGS. 1D and 2D in accordance with some embodiments. In some embodiments, the top surface of the power rail 116 is exposed to air. In some embodiments, the thickness of the second spacer 118 is in a range from about 5 nm to 20 nm. If the second spacer 118 is too thick, it may be difficult to fill in the gap between the adjacent second spacers 118 in the following process. If the second spacer 118 is too thin, the material that fills the gap between the adjacent second spacers 118 may be too thick and may affect the uniformity. Moreover, the subsequently formed contact structure landing on the power rail 116 may be too small resulting high contact resistance and device performance degradation. In some embodiments, the second spacer 118 is made of insulating materials such as silicon oxide, silicon nitride, silicon carbide nitride, fluorosilicate glass (FSG), a low-k dielectric material, another suitable dielectric material, or a combination thereof. In some embodiments, the first spacer 110 and the second spacer 118 are made of the same material. Therefore, the first spacer 110 and the second spacer 118 may be etched in the same process, which may reduce the production time and cost, and the uniformity may be well controlled. The second spacer 118 may be deposited by an atomic layer deposition (ALD) process, a chemical vapor deposition (CVD) process, a flowable CVD (FCVD) process, or another applicable process. Afterwards, a planarization process, such as a CMP process, may be performed on the second spacer 118 until the top surfaces of the first spacer 110 are exposed.

Figure 1E:
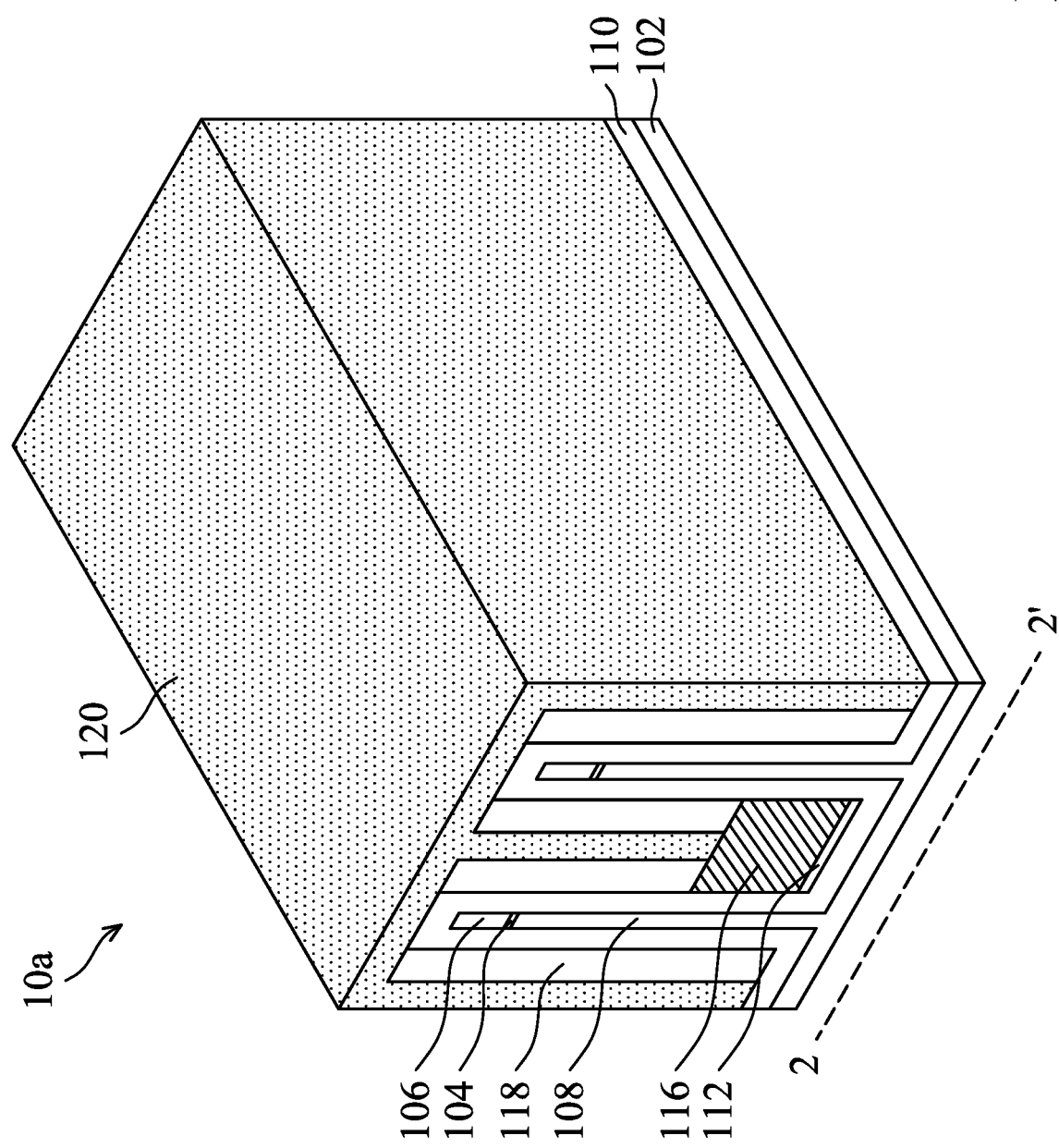
Figure 2E:
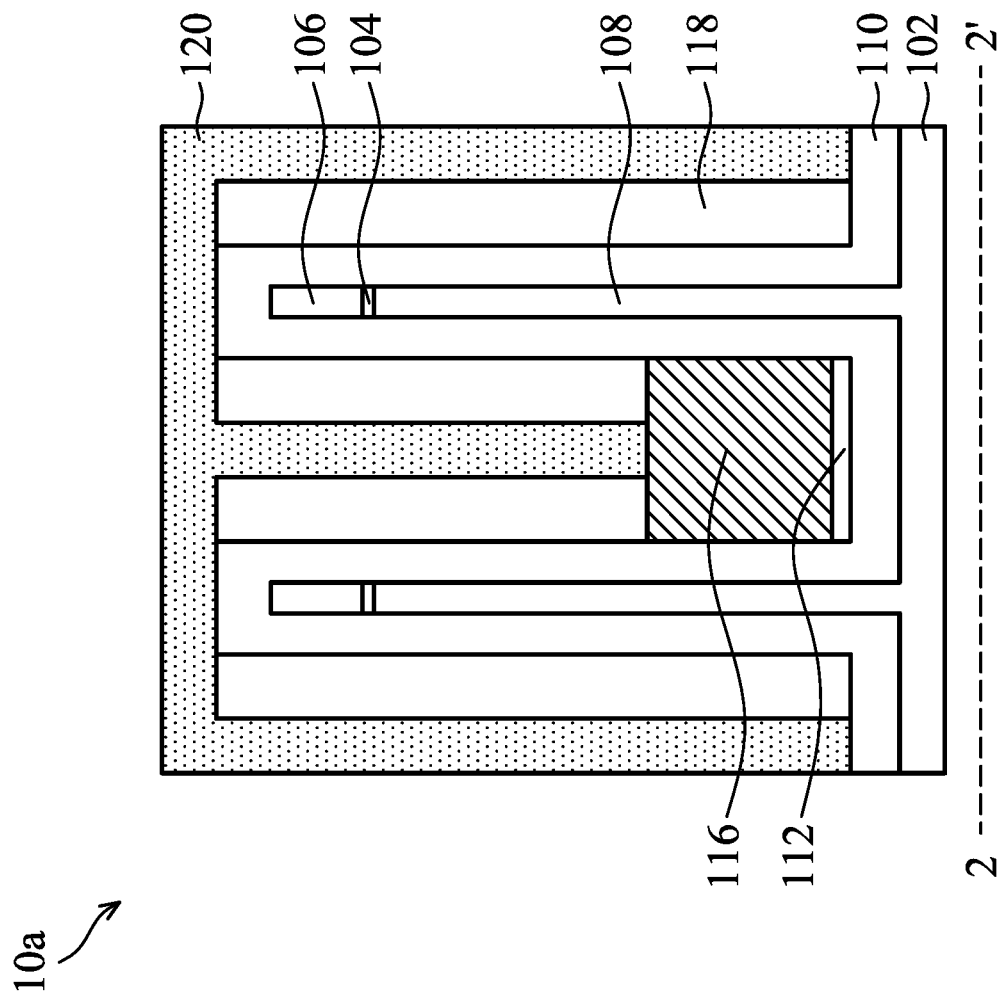

Next, an insulating layer 120 is formed over the first spacer 110, the second spacer 118, and the power rail 116 as shown in FIGS. 1E and 2E in accordance with some embodiments. In some embodiments, the insulating layer 120 completely fills the space between the second spacers 118, and the power rail 116 is covered by the second spacers 118 and the insulating layer 120. In some embodiments, the material of the insulating layer 120 can be selectively etched relative to the material of the first spacer 110 and the second spacer 118 in the following processes. In some embodiments, the insulating layer 120 is made of silicon oxide, silicon nitride, silicon carbide nitride, SiOC, SiOCN, Metal oxide, fluorosilicate glass (FSG), a low-k dielectric material, another suitable dielectric material, or a combination thereof. In some embodiments, the insulating layer 120 is made of a bi-layer material. For example, the insulating layer 120 may be formed by depositing a low-k dielectric material first and then depositing a high-k dielectric material later. The insulating layer 120 may be deposited by an atomic layer deposition (ALD) process, a chemical vapor deposition (CVD) process, a flowable CVD (FCVD) process, or another applicable process.

Figure 1F:
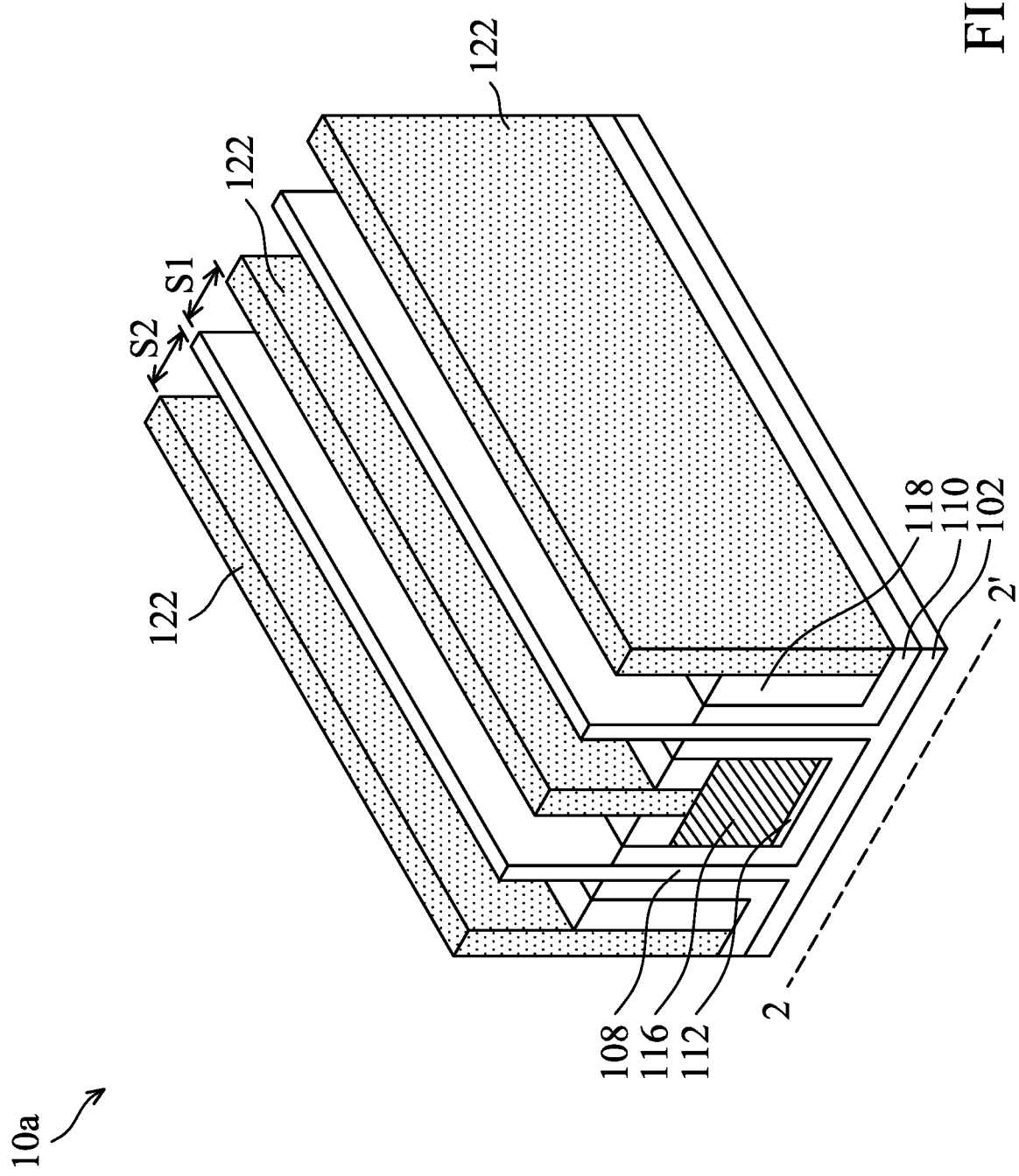
Figure 2F:
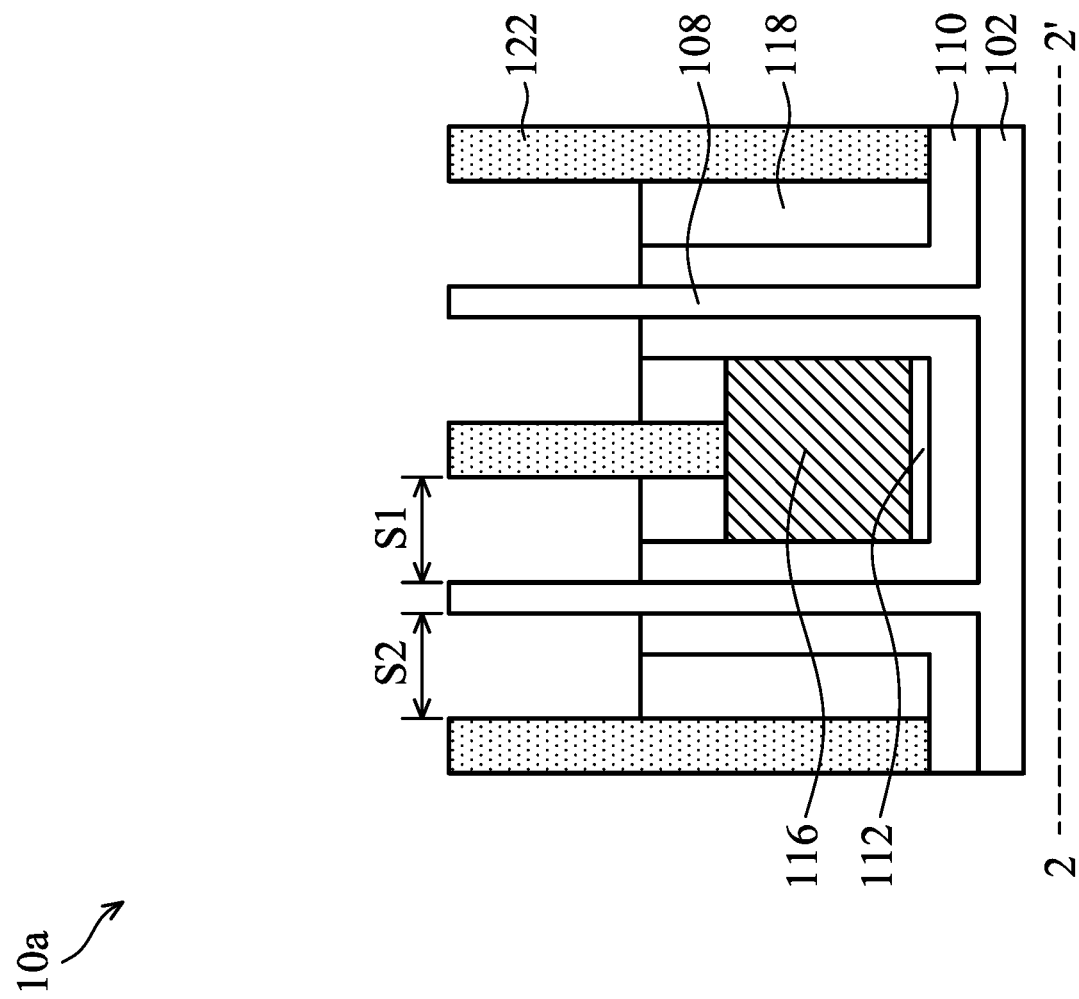

The insulating layer 120, the first spacer 110, and the second spacer 118 may be planarized first to expose the top surface of the hard mask layer 106. The insulating layer 120, the first spacer 110, and the second spacer 118 may be planarized by a chemical mechanical polishing (CMP) process. Afterwards, the hard mask layer 106 is removed, as shown in FIGS. 1F and 2F in accordance with some embodiments. The hard mask layer 106 may be removed by a wet etching process, which may include using a phosphoric acid ($H_3PO_4$) etching solution.

Next, as shown in FIGS. 1F and 2F in accordance with some embodiments, an etching process is performed on the first spacer 110 and the second spacer 118. The etching process may be used to remove the top portion of the first spacer 110 and the top portion of the second spacer 118. As a result, the fin isolation structures 122 may be formed and the top portion of the fin structure 108 and the fin isolation structures 122 may be exposed. The remaining first spacer 110 and the second spacer 118 may surround the base portion of the fin structure 108 and the fin isolation structures 122 and may cover the top surface of the power rail 116. In some embodiments, the fin isolation structure 122 between adjacent second spacers 118 protrude from the top surface of the power rail 116. In some embodiments, the spacing difference of space S1 and S2 between the fin structures 108 to adjacent fin isolation structures 122 is in a range from about 0.5% to about 5%. If the spacing difference between space S1 and space S2 is significant, the uniformity of the process worsen.

In some embodiments, since the material of the insulating layer 120 can be selectively etched relative to the material of the first spacer 110 and the second spacer 118, the first spacer 110 and the second spacer 118 are made of different materials than that of the fin isolation structures 122. Therefore, the insulating layer 120 may not be consumed as the first spacer 110 and the second spacer 118 being etched.

The remaining first spacer 110 and the second spacer 118 may be an isolation structure such as a shallow trench isolation (STI) structure surrounding the base portion of the fin structures 108. The isolation structure may be configured to prevent electrical interference or crosstalk.

Figure 1G:
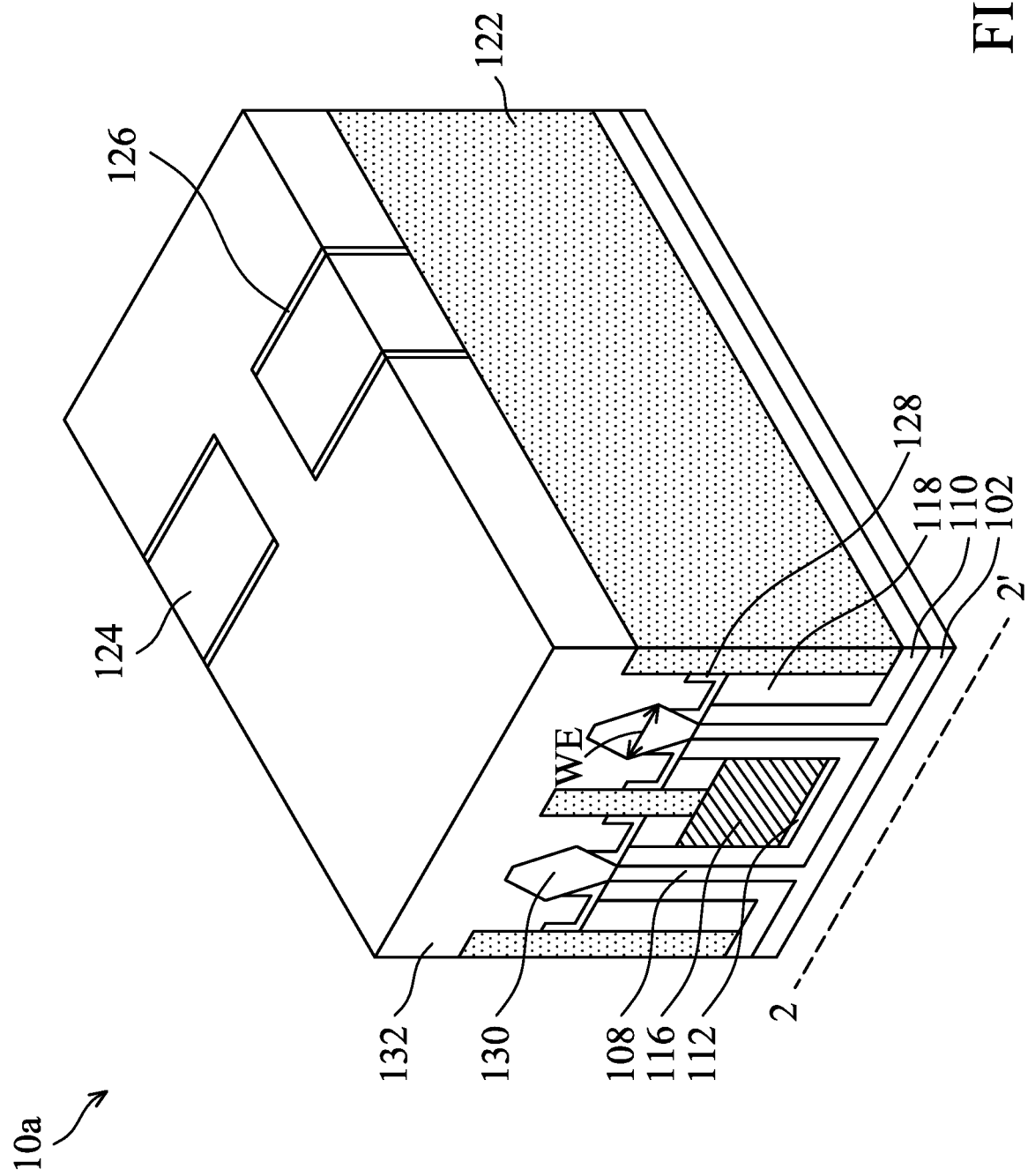

Next, a gate structure 124 is formed over and across the fin structures 108, as shown in FIGS. 1G and 2G in accordance with some embodiments. In some embodiments, the gate structure 124 includes a gate dielectric layer and a gate electrode layer (not shown). In some embodiments, the gate dielectric layer is a dummy gate dielectric layer and the gate electrode layer is a dummy gate electrode layer. The dummy gate dielectric layer and the dummy gate electrode layer may be replaced by the following steps to form a real gate structure with a high-k dielectric layer and a metal gate electrode layer.

The gate dielectric layer may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer may include polycrystalline-silicon (poly-Si), polycrystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process is performed on the gate dielectric layer and the gate electrode layer to form the gate structure 124 by using a patterned photoresist layer as a mask (not shown). The etching process may be a dry etching process or a wet etching process. In some embodiments, the gate dielectric layer and the gate electrode layer are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 108 may be exposed on the opposite sides of the gate structure 124.

The gate structures 124 are formed across the fin structures 108 separately as different gate structures 124, as shown in FIGS. 1G and 2G in accordance with some embodiments. In some embodiments, a single gate structure 124 is formed across two or more fin structures 108, depending on the demand of the circuit design.

Next, a pair of gate spacers 126 are formed on opposite sidewalls of the gate structure 124, as shown in FIGS. 1G and 2G in accordance with some embodiments. The gate spacers 126 may be made of silicon oxide, silicon nitride, silicon oxynitride, and/or dielectric materials. In some embodiments, the gate spacers 126 are formed by a chemical vapor deposition (CVD) process, a spin-on-glass process, or another applicable process.

Next, a fin spacer 128 is conformally formed over the fin structures 108 and the fin isolation structures 122 in accordance with some embodiments. Afterwards, the fin spacer 128 may be etched by an etching process to expose the top portion of the fin structures 108 and the fin isolation structures 122. The remain height of the fin spacer 128 on the sidewalls of the fin structures 108 may determine the size of the substantially formed epitaxial structures over the fin structures 108. The fin spacer 128 may be oxides, nitrides, high-k materials, low-k materials, other insulating materials, or a combination thereof. The fin spacer 128 may be deposited by LPCVD (low pressure CVD), PECVD (plasma enhanced CVD), HDP-CVD (high density plasma CVD), APCVD (atmospheric pressure CVD), radical enhanced CVD, ATD (atomic layer deposition), ATCVD (atomic layer CVD), other applicable deposition processes, or a combination thereof. The etching process may be a dry etching process.

Afterwards, the top portion of the fin structure 108 exposed on the opposite sides of the gate structure 124 is removed by an etching process (not shown) to form a recess. The etching process may be a dry etching process or a wet etching process. In some embodiments, the fin structures 108 are etched by a dry etching process. The dry etching process may include using a fluorine-based etchant gas, such as $SF_6$, $C_xF_y$ (where x and y may be positive integers), $NF_3$, or a combination thereof.

Next, as shown in FIGS. 1G and 2G in accordance with some embodiments, an epitaxial structure 130 is formed in the recess over the fin structure 108. In some embodiments, a strained material is grown in the recess by an epitaxial (epi) process to form the epitaxial structure 130. In addition, the lattice constant of the strained material may be different from the lattice constant of the substrate 102. In some embodiments, the epitaxial structure 130 may include Ge, SiGe, InAs, InGaAs, InSb, GaAs, GaSb, InAlP, InP, SiC, SiP, other applicable materials, or a combination thereof. In some embodiments, the epitaxial structure 130 is formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. In some embodiments, the width WE of the epitaxial structure 130 is in a range from about 14 nm to about 26 nm. If the width WE of the epitaxial structure 130 is too wide, it may decrease the landing area of the subsequently formed contact structure over the power rail 116. If the width WE of the epitaxial structure 130 is too narrow, there may not be enough stress caused by the epitaxial structure 130.

After the epitaxial structure 130 is formed, an inter-layer dielectric (ILD) structure 132 is formed to cover the epitaxial structure 130 and the fin isolation structures 122, as shown in FIGS. 1G and 2G in accordance with some embodiments. The inter-layer dielectric structure 132 may include multilayers made of multiple dielectric materials, such as silicon oxide, silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The inter-layer dielectric structure 132 may be formed by chemical vapor deposition (CVD), spin-on coating, or another applicable process.

Afterwards, a planarizing process is performed on the ILD structure 132 until the top surface of the gate structures 124 is exposed, as shown in FIGS. 1G and 2G in accordance with some embodiments. After the planarizing process, the top surface of the gate structure 124 may be substantially level with the top surfaces of the gate spacers 126 and the ILD structure 132. In some embodiments, the planarizing process includes a grinding process, a chemical mechanical polishing (CMP) process, an etching process, another applicable process, or a combination thereof.

Figure 1H:
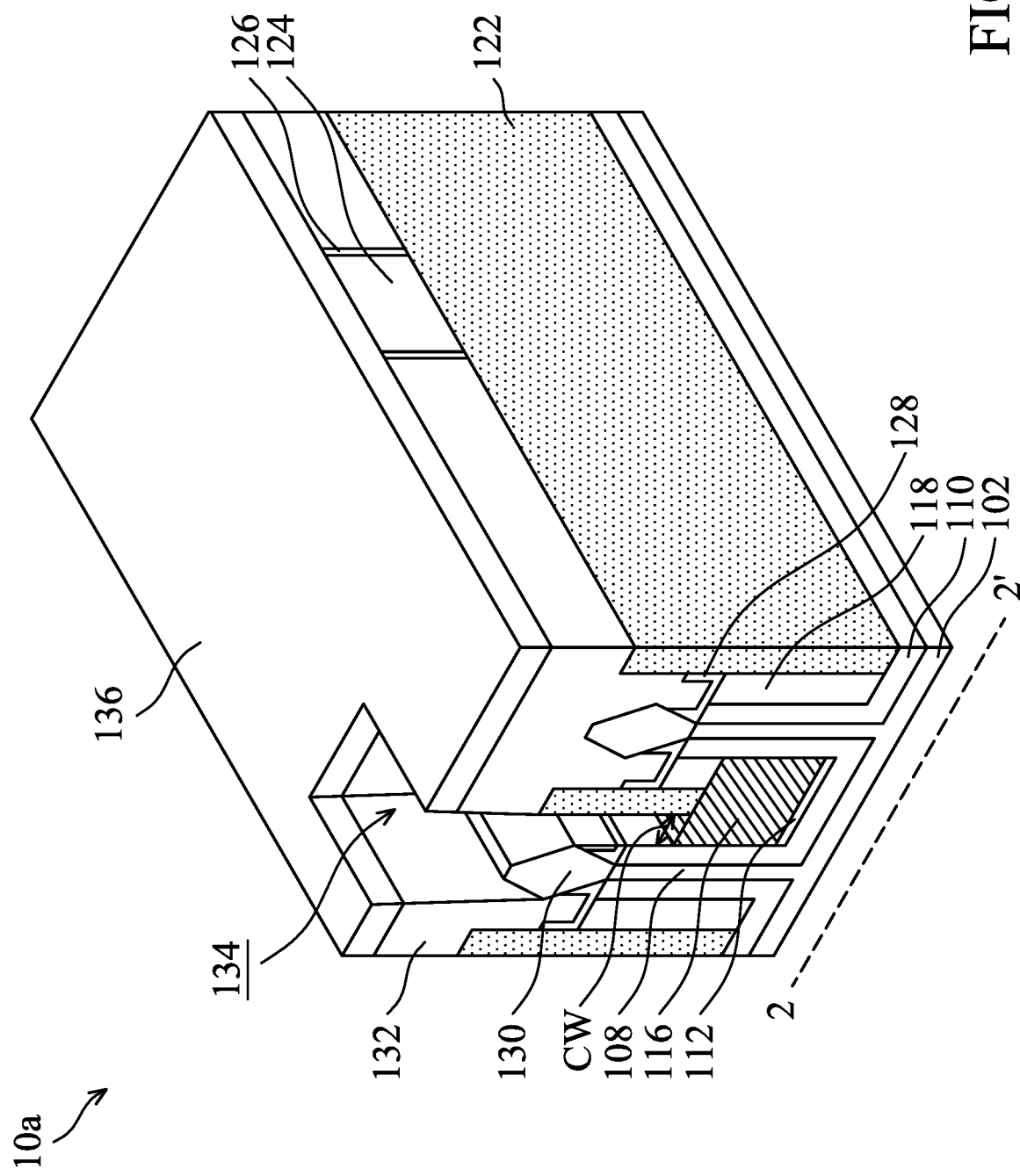
Figure 2H:
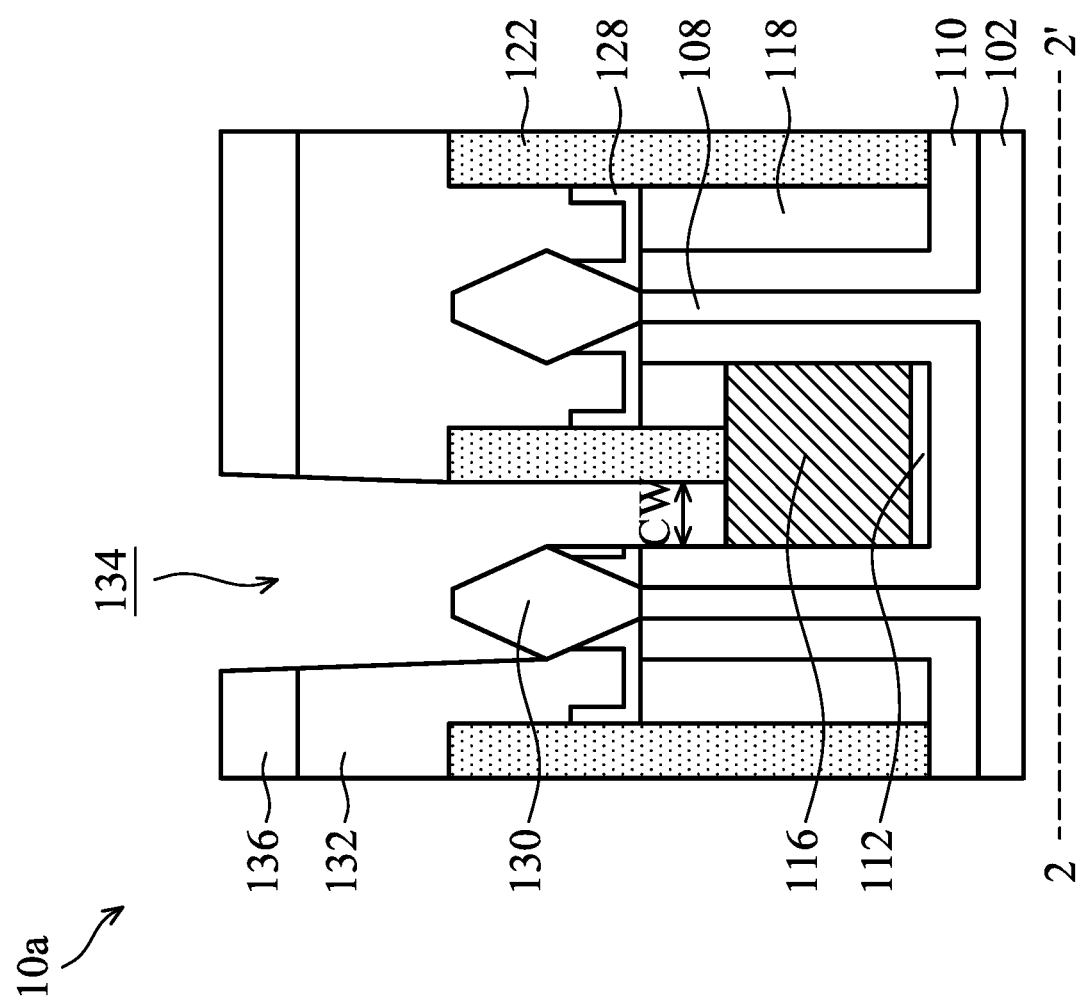

Afterwards, a patterning and an etching process are performed to form an opening 134 by using a patterned photoresist layer 136 as a mask, as shown in FIGS. 1H and 2H in accordance with some embodiments. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. In some embodiments, a portion of the epitaxial structure 130 and a portion of the top surface of the power rail 116 are exposed from the opening 134. In some embodiments, a sidewall of the opening 134 is aligned with a sidewall of the fin isolation structure 122 since the material of the fin isolation structure 122 can be selectively etched relative to the material of the second spacer 118.

In some embodiments, the width CW of the power rail 116 exposed to the opening 134 is in a range from about 8 nm to about 30 nm. If the width CW of the power rail 116 is too wide, the isolation between the fin structure 108 and the subsequently formed contact structure may be not enough. If the width CW of the power rail 116 is too narrow, the bottom area of the contact structure subsequently formed in the opening 134 may be small, and the contact resistance may be great.

Figure 1I:
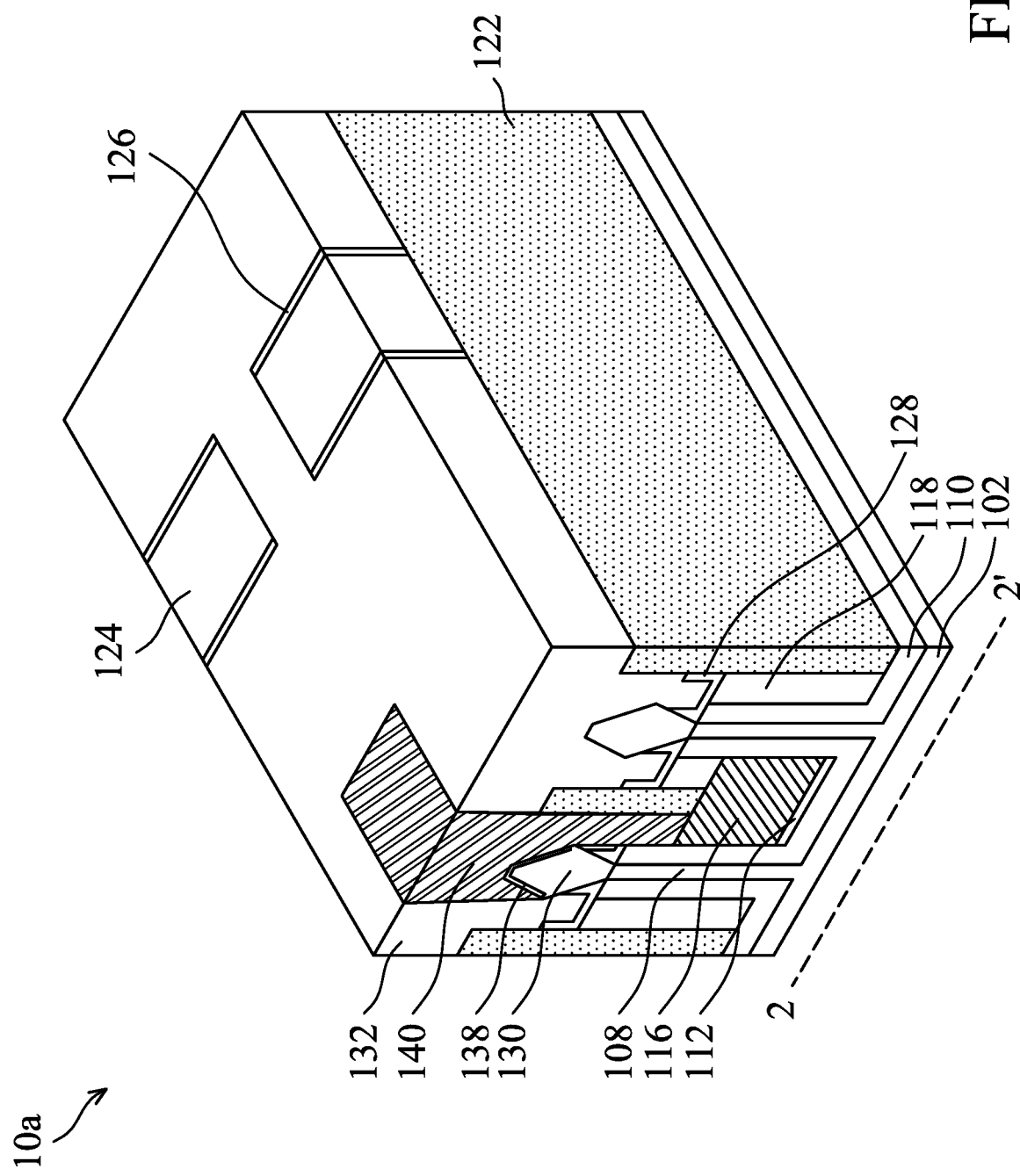
Figure 2I:
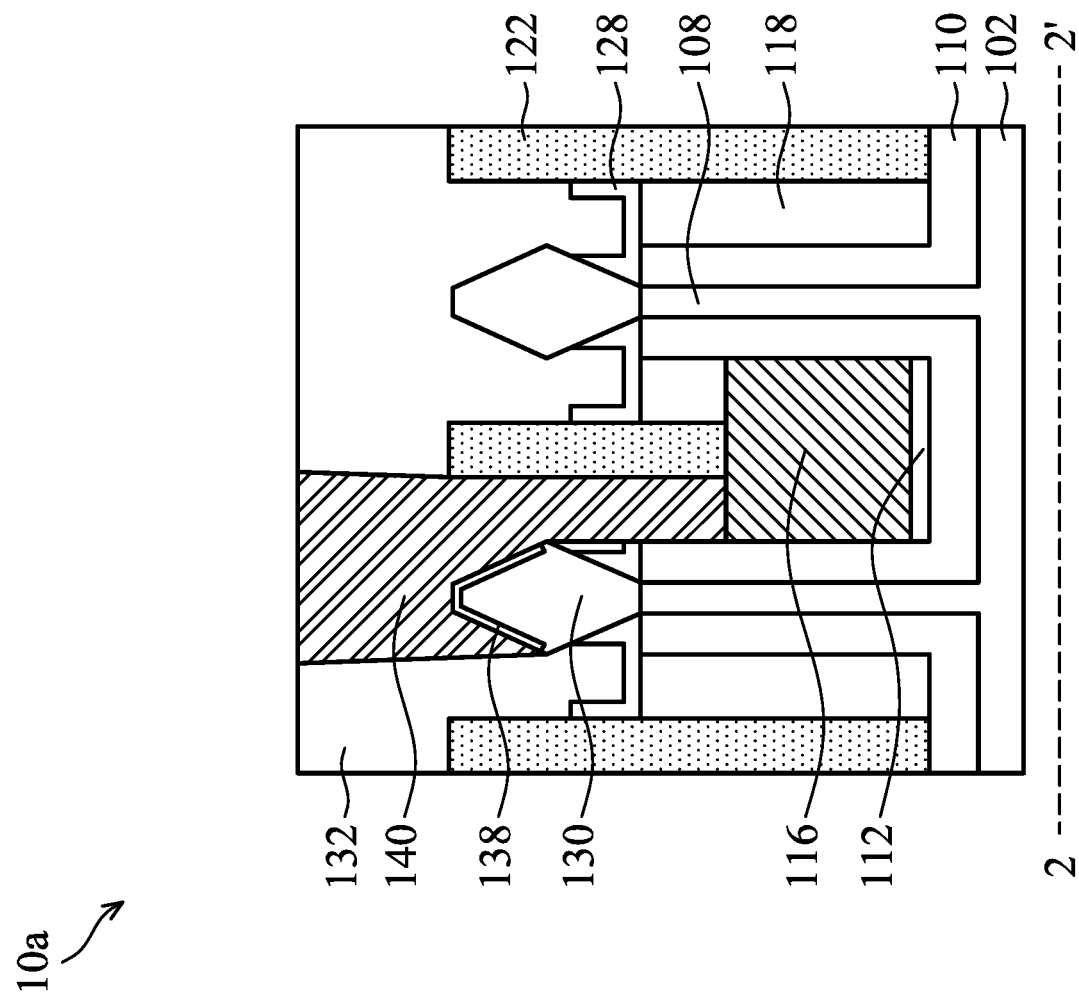

Next, a metal semiconductor compound layer 138 is formed over the epitaxial structure 130, as shown in FIGS. 1I and 2I in accordance with some embodiments. The metal semiconductor compound layer 138 may reduce the contact resistance between the epitaxial structure 130 and the subsequently formed contact structure over the epitaxial structure 130. The metal semiconductor compound layer 138 may be made of titanium silicide ($TiSi_2$), nickel silicide (NiSi), cobalt silicide (CoSi), or another suitable low-resistance material. The semiconductor compound layer 138 may be formed on the epitaxial structure 130 by forming a metal layer over the epitaxial structure 130 first. The metal layer may react with the epitaxial structure 130 by an annealing process and the semiconductor compound layer 138 may be produced. Afterwards, the unreacted metal layer may be removed by an etching process and the semiconductor compound layer 138 may be left.

In some embodiments, the thickness of the metal semiconductor compound layer 138 is in a range from about 0.5 nm to about 5 nm. With reduced semiconductor compound layer 138 thickness, the landing area of the subsequently formed contact structure may be enlarged. If the thickness of the metal semiconductor compound layer 138 is too thin, the contact resistance may increase. If the metal semiconductor compound layer 138 is too thick, there may not be enough of a landing area for the subsequently formed contact structure.

Afterwards, a first contact structure 140 is filled into the opening 134, as shown in FIGS. 1I and 2I in accordance with some embodiments. The first contact structure 140 may be made of metal materials (e.g., W, Al, or Cu), metal alloys, poly-Si, other applicable conductive materials, or a combination thereof. The first contact structure 140 can be formed by using a chemical vapor deposition process (CVD), a physical vapor deposition process (PVD, e.g., evaporation or sputter), an atomic layer deposition process (ALD), an electroplating process, another suitable process, or a combination thereof to deposit the conductive materials of the first contact structure, and then optionally performing a chemical mechanical polishing (CMP) process or an etching back process to remove excess conductive materials. In some embodiments, since the sidewall of the opening 134 is aligned with a sidewall of the fin isolation structure 122, the sidewall of the first contact structure 140 is aligned with a sidewall of the fin isolation structure 122. In some embodiments, the first contact structure 140 is in direct contact with the top portion of the fin structure 108 (i.e., the epitaxial structure 130) and a portion of the power rail 116.

Figure 1J:
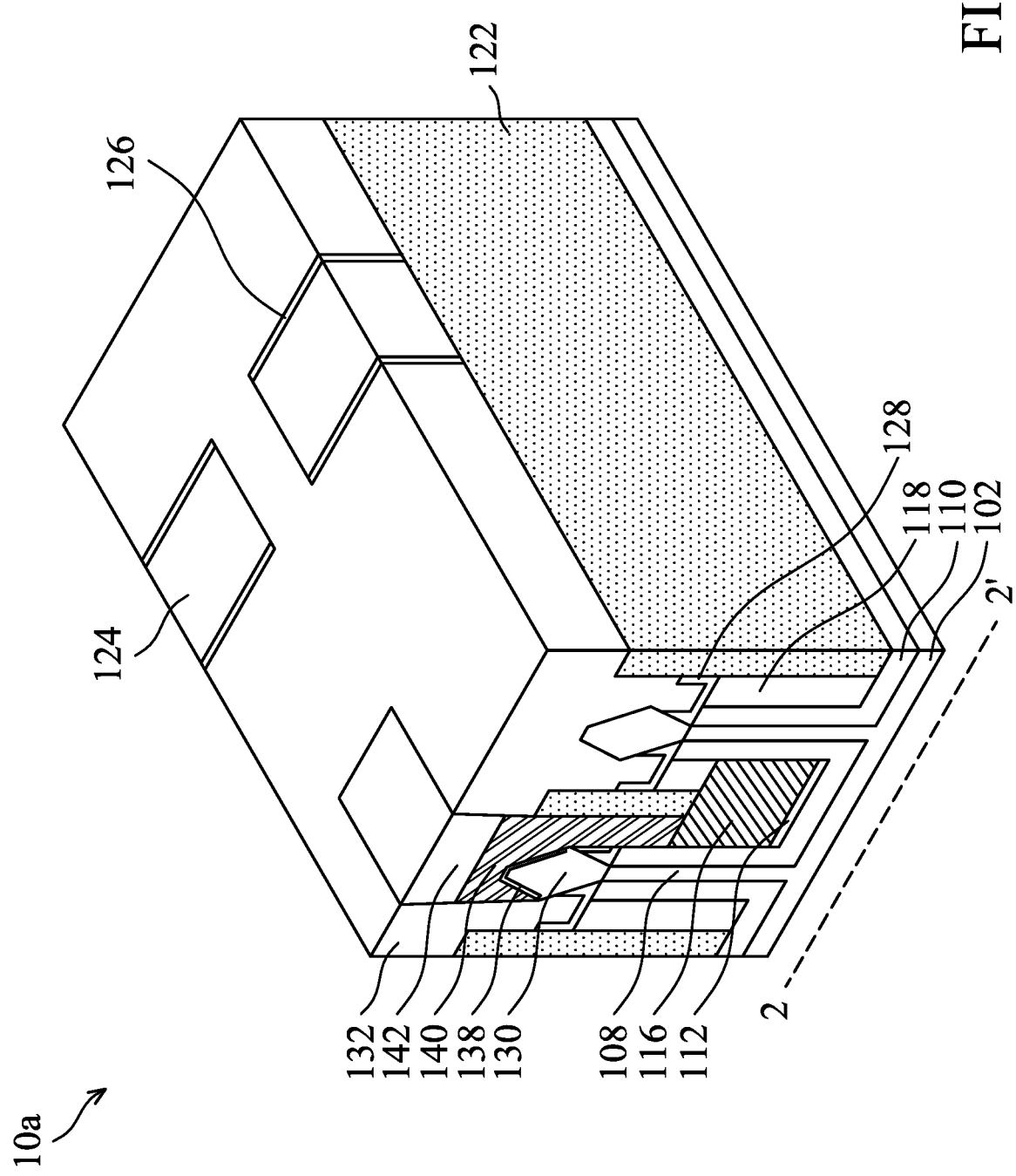
Figure 2J:
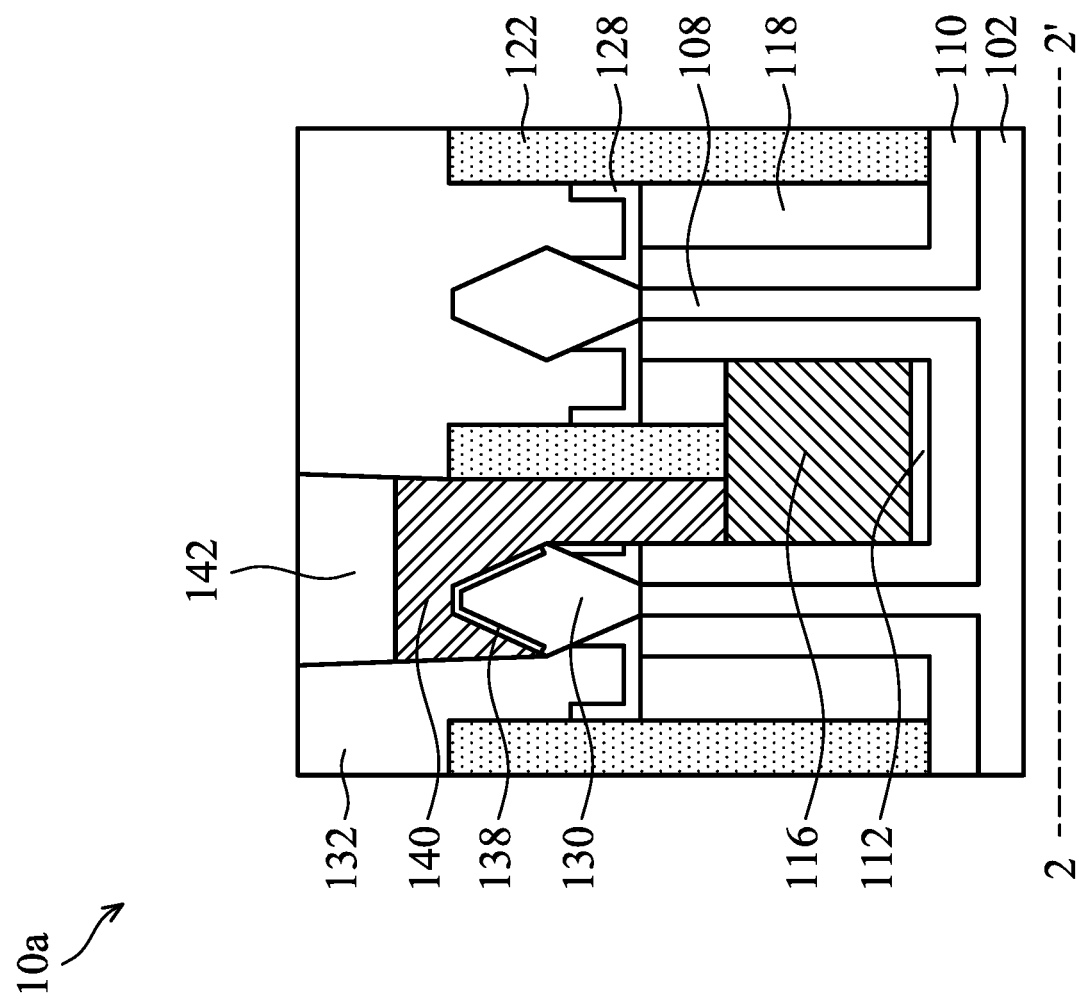

Next, the top portion of the first contact structure 140 is optionally removed to form a recess (not shown) and a first cap layer 142 is optionally formed in the recess over the first contact structure 140, as shown in FIGS. 1J and 2J in accordance with some embodiments. The first cap layer 142 may include silicon nitride. In some embodiments, the first cap layer 142 be formed on the first contact structure 140 by low-pressure chemical vapor deposition (LPCVD) or plasma enhanced chemical vapor deposition (PECVD), other suitable deposition processes, or a combination thereof. After the first cap layer 142 is deposited, a planarization process (e.g., a chemical mechanical polishing process or an etching back process) may optionally be performed to remove excess dielectric materials.

Figure 1K:
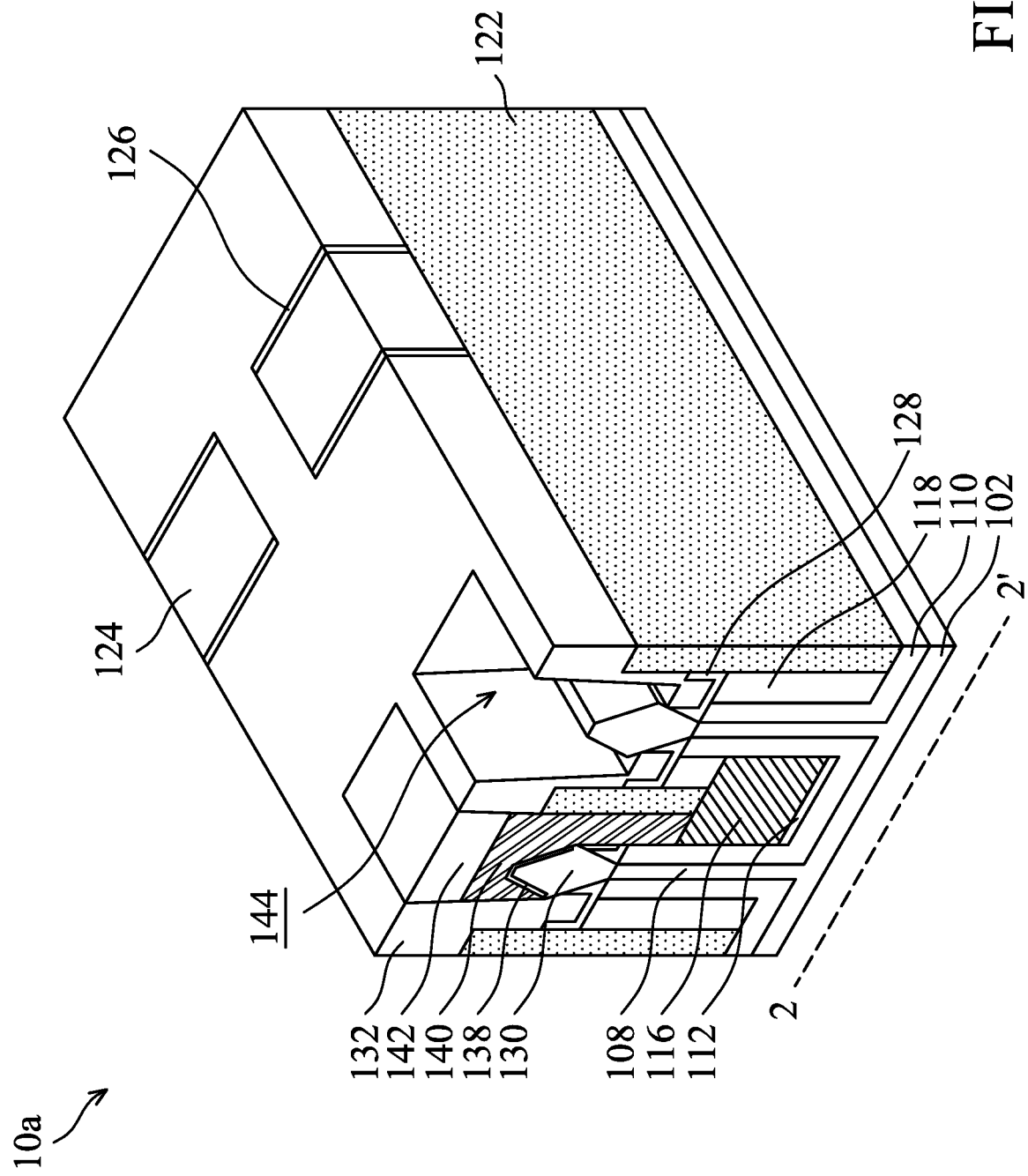
Figure 2K:
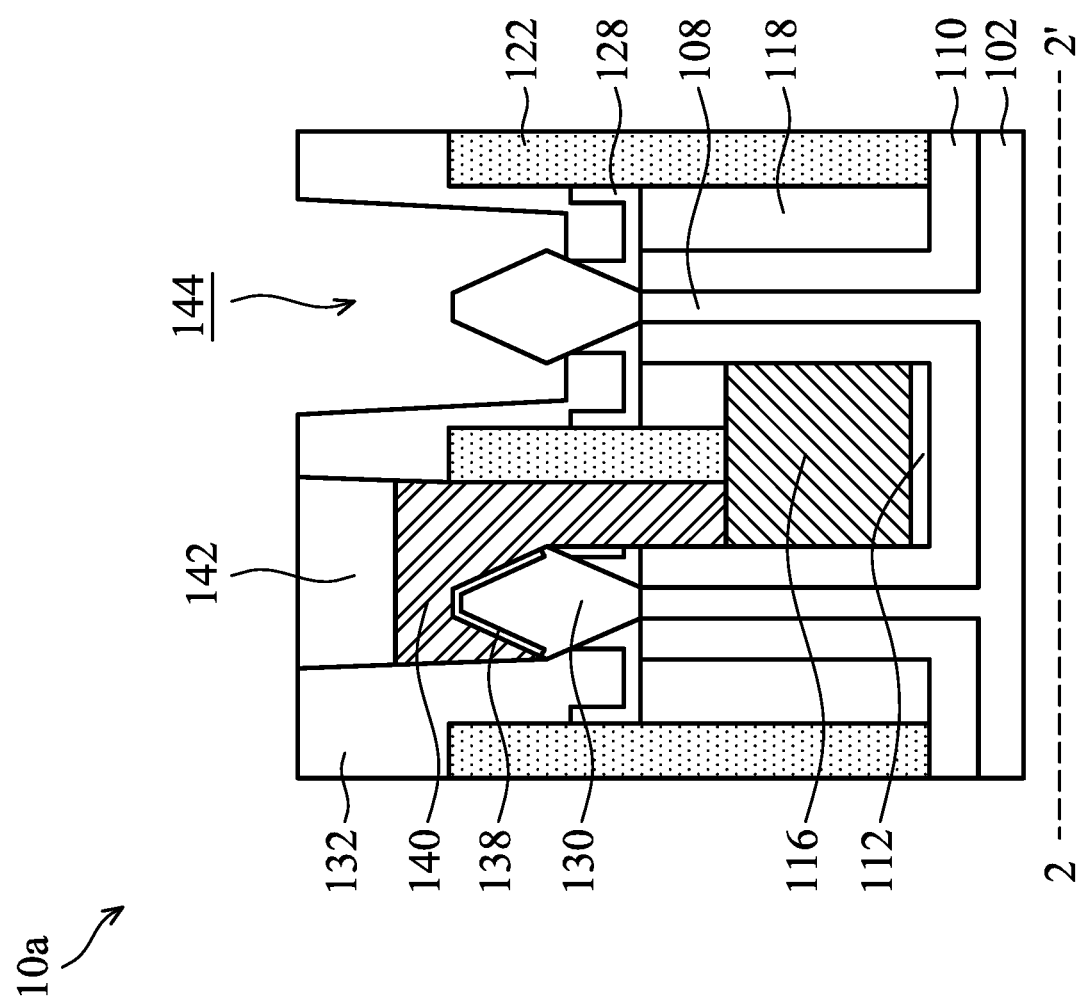

Afterwards, an opening 144 is formed over the fin structures 108, as shown in FIGS. 1K and 2K in accordance with some embodiments. The processes for forming the opening 144 are the same as, or similar to, those used to form the opening 134. For the purpose of brevity, the descriptions of these processes are not repeated herein. The difference from forming the opening 134 described above is that, the opening 144 only exposes the epitaxial structure 130, and the power rail 116 is not exposed from the opening 144.

Figure 1L:
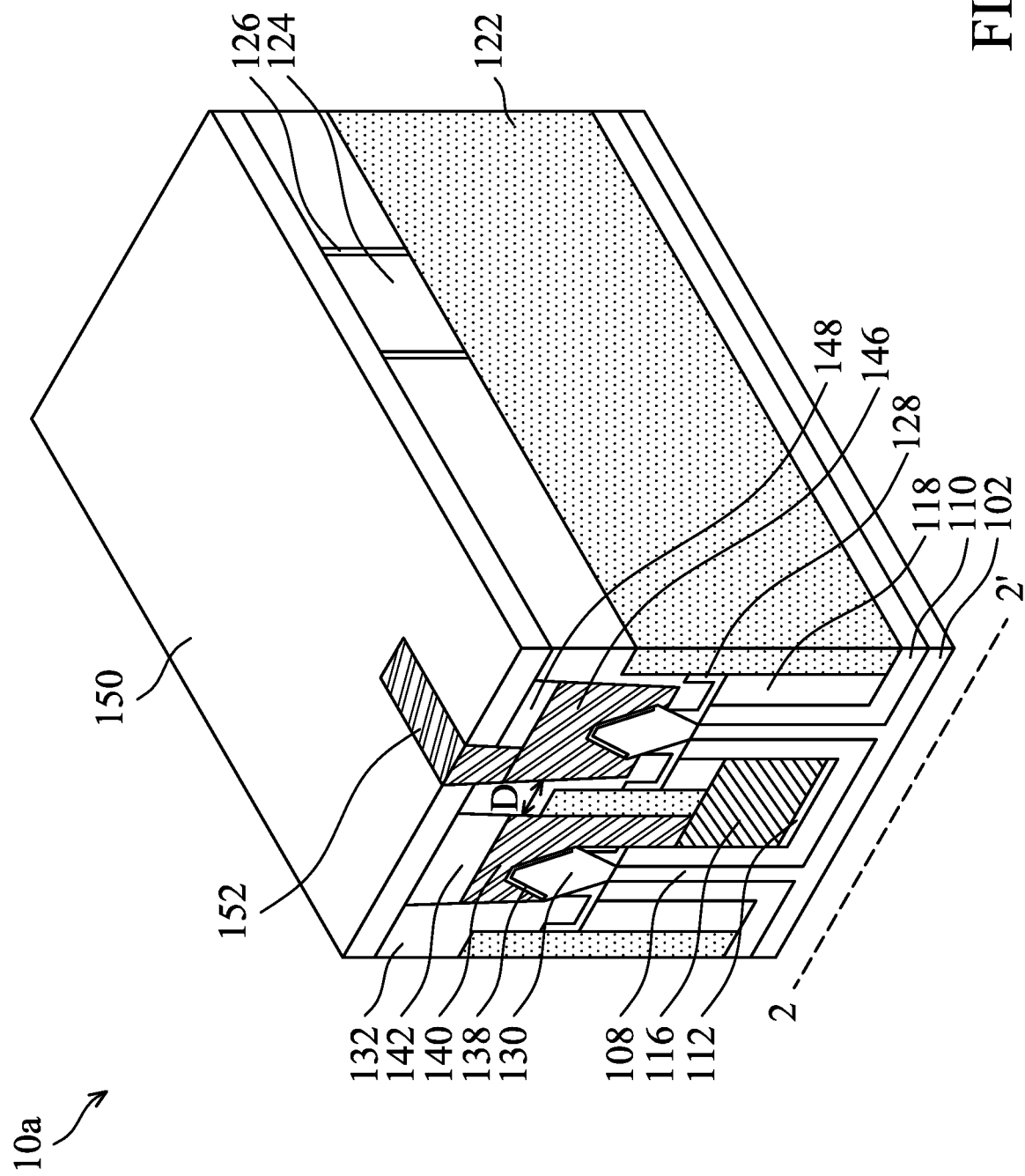
Figure 2L:
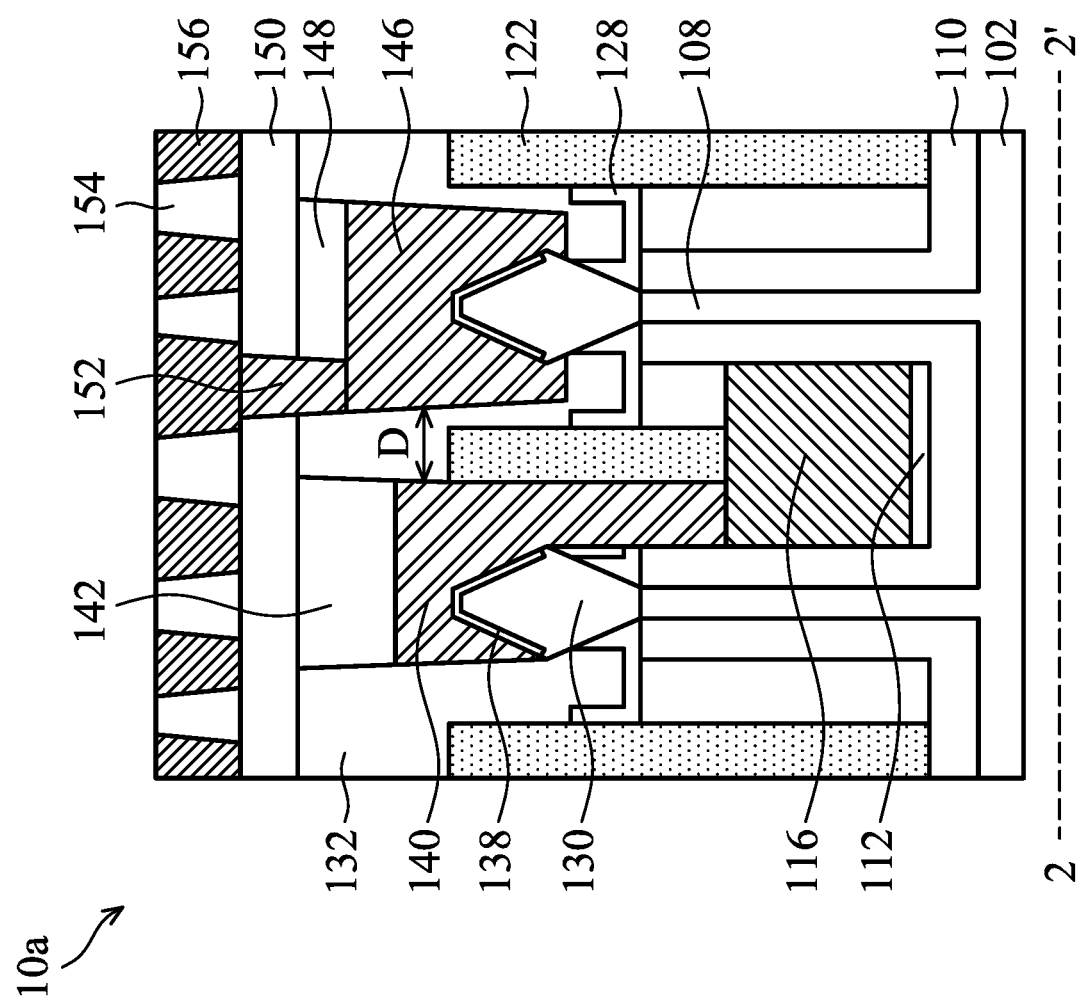

Afterwards, a semiconductor compound layer 138 is formed over the epitaxial structure 130 in the opening 144, and a second contact structure 146 is filled into the opening 144, as shown in FIGS. 1L and 2L in accordance with some embodiments. The processes of forming the semiconductor compound layer 138 and the second contact structure 146 are the same as, or similar to, those used to form the semiconductor compound layer 138 in the opening 134 and the first contact structure 140. For the purpose of brevity, the descriptions of these processes are not repeated herein.

In some embodiments, by forming the first contact structure 140 and the second contact structure 146 by a mask layer, compared to the case in which the first contact structure 140 and the second contact structure 146 are formed as a continuous strip contact structure and being cut later, the speed of the FinFET device structure 10a may improve in a range from about 0.1% to about 5%.

In some embodiments, the semiconductor compound layer 138 is formed over both the epitaxial structures 130 at the same time before forming the first contact structure 140 and the second contact structure 146. Therefore, the production time and cost may be reduced.

In some embodiments, the distance D between the first contact structure 140 and the second contact structure 146 is in a range from about 5 nm to about 20 nm. If the distance is too short, the first contact structure 140 and the second contact structure 146 may short-circuit. If the distance is too far, there may not be enough of a landing area for the first contact structure 140 and the second contact structure 146.

Next, the top portion of the second contact structure 146 is optionally removed to form a recess (not shown) and a second cap layer 148 is optionally formed in the recess over the second contact structure 146, as shown in FIGS. 1L and 2L in accordance with some embodiments. The processes of forming the second cap layer 148 are the same as, or similar to, those used to form the first cap layer 142. For the purpose of brevity, the descriptions of these processes are not repeated herein. In some embodiments, the first cap layer 142 and the second cap layer 148 have different thicknesses. Therefore, the capacitance may be fine-tuned by changing the thickness of the cap layer.

Next, an etch stop layer 150 is blanketly formed over the first contact structure 140, the second contact structure 146, the ILD structure 132, and the gate structure 124, as shown in FIGS. 1L and 2L in accordance with some embodiments. The etch stop layer 150 may be made of $SiO_2$, $Si_3N_4$, SiON, $Al_2O_3$, MgO, $Sc_2O_3$, HfO2, HfSiO, HfSiON, HfTaO, HfTiO, HfZrO, LaO, ZrO, $TiO_2$, $ZnO_2$, $ZrO_2$, or $Ta_2O_5$, the like, or a combination thereof. The etch stop layer 150 may be formed by depositing dielectric materials in a chemical vapor deposition process (CVD) (such as plasma enhanced chemical vapor deposition (PECVD) or high density plasma chemical vapor deposition (HDPCVD)), an atomic layer deposition (ALD) process, or using another suitable technique to deposit dielectric materials.

Afterwards, a third contact structure 152 is formed in the etch stop layer 150 over the second contact structure 146, as shown in FIGS. 1L and 2L in accordance with some embodiments. In some embodiments, the third contact structure 152 is electrically connected to the second contact structure 146. In some embodiments, the projection area of the third contact structure 152 on the substrate 102 is less than the projection area of the second contact structure 146 on the substrate 102. Therefore, the landing area of the second contact structure 146 on the epitaxial structure 130 may be maximized and the third contact structure 152 may be able to connect to subsequently formed metal layers which have a smaller area.

Next, a dielectric layer 154 is formed over the etch stop layer 150 and a metal layer 156 is formed in the dielectric layer 154, as shown in FIG. 2L in accordance with some embodiments. In some embodiments, the metal layer 156 is in direct contact with and electrically connected to the third contact structure 152. The dielectric layer 154 may be made of silicon oxide. The dielectric layer 154 may be deposited by CVD processes such as atmospheric pressure CVD (APCVD), low-pressure CVD (LPCVD), and plasma-enhanced CVD (PECVD).

The metal layer 156 may include Cu, W, Ag, Ag, Sn, Ni, Co, Cr, Ti, Pb, Au, Bi, Sb, Zn, Zr, Mg, In, Te, Ga, other applicable metallic materials, an alloy thereof, or a combination thereof. In some embodiments, the metal layer 156 includes a stacked structure of TiN/AlCu/TiN. The metal layer 156 may be deposited by a physical vapor deposition process (e.g., evaporation or sputtering), an atomic layer deposition process (ALD), an electroplating process, other applicable processes or a combination thereof, and then a chemical mechanical polishing (CMP) process or an etching back process is then optionally performed to remove excess conductive materials.

A gate contact structure may also be formed in the etch stop layer 150 over the gate structures 124 (not shown). In some embodiments, the gate contact structure is electrically connected to the gate structures 124. The processes of forming the gate contact structure are the same as, or similar to, those used to form the third contact structure 152. For the purpose of brevity, the descriptions of these processes are not repeated herein.

With a single first contact structure 140 connecting the epitaxial structure 130 and the power rail 116, the cell height of the FinFET device structure 10a on the chip may be further shrunk in a range from about 5% to about 20%. The speed of the FinFET device structure 10a may improve in a range from about 0.5% to about 20%. With first spacer 110 and the second spacer 118, the area of the first contact structure 140 may increase in a range from about 5% to about 20%.

With double spacers including the first spacer 110 and the second spacer 118 covering the sidewalls of the fin structures 108, the power rail 116 between the fin structures 108 under the epitaxial structures 130 may have a greater width, offering a larger landing area for the first contact structure 140. Moreover, the reduced epitaxial structure width WE may also offer more room for larger landing area for the first contact structure 140. Therefore, the resistance of the first contact structure 140 may be reduced, and the performance may be improved.

Many variations and/or modifications may be made to the embodiments of the disclosure. FIGS. 3A-3H are perspective representations of various stages of forming a modified FinFET device structure 10b, in accordance with some other embodiments of the disclosure. Some processes or devices are the same as, or similar to, those described in the embodiments above, and therefore the descriptions of these processes and devices are not repeated herein. The difference from the embodiments described above is that, as shown in FIGS. 3A and 4A in accordance with some embodiments, after forming the power rail 116, an isolation structure 218 fills the space between the fin structures 108 and covers the power rail 116.

FIGS. 3A-3H are perspective representations of various stages of forming the FinFET device structure 10b, and FIGS. 4A-4H show cross-sectional representations taken along line 4-4' in FIGS. 3A-3H in accordance with some other embodiments.

Figure 3A:
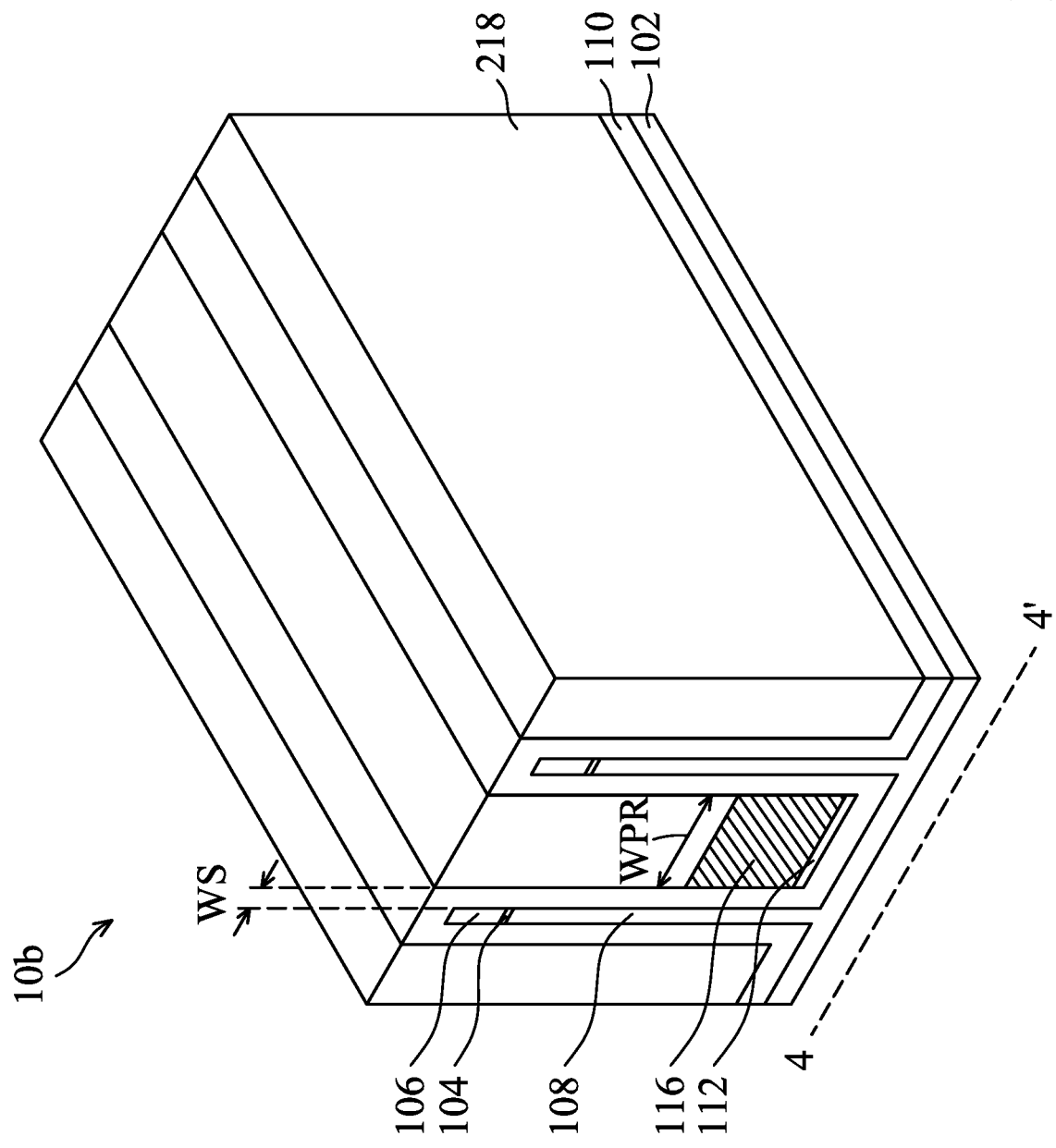
FIGS. 3A-3H are perspective representations of various stages of forming a modified FinFET device structure, in accordance with some embodiments of the disclosure.
Figure 4A:
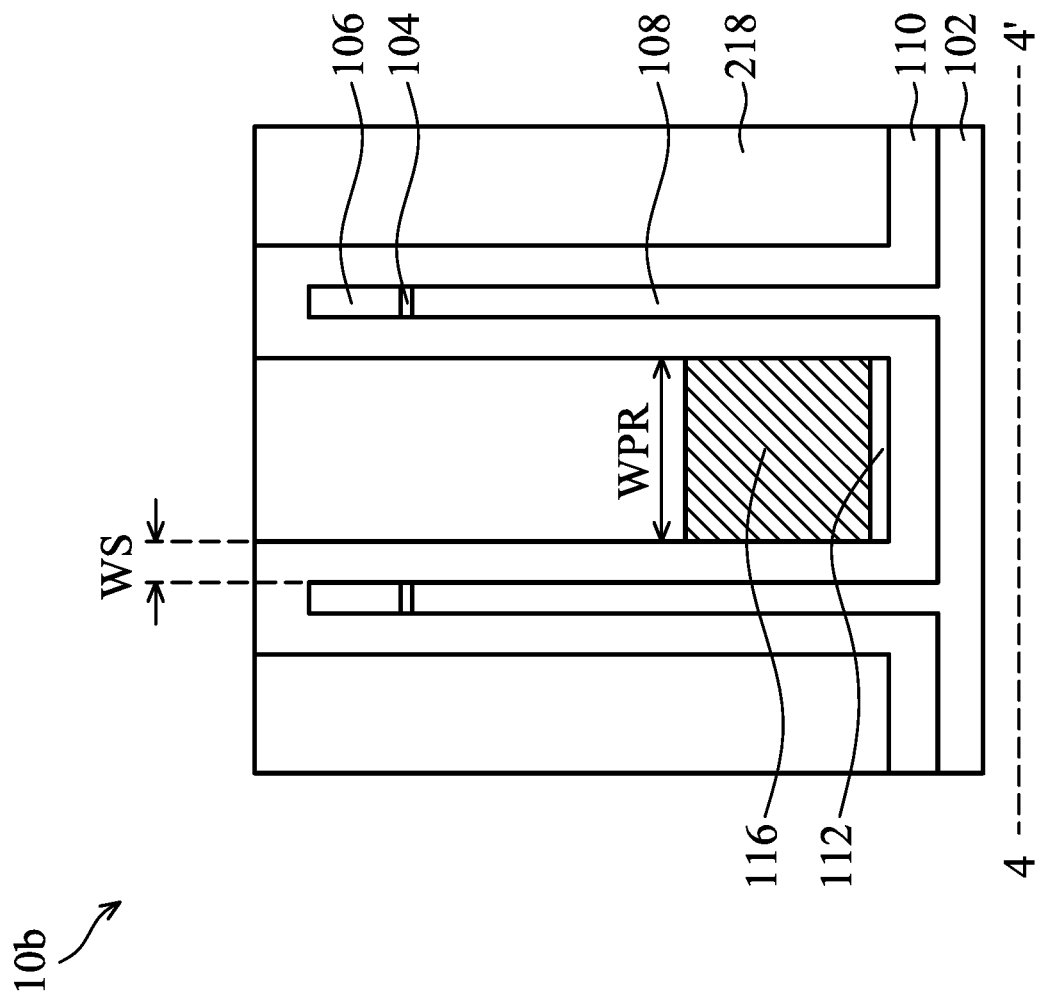
FIGS. 4A-4H are cross-sectional representations of various stages of forming a modified FinFET device structure shown in FIGS. 3A-3H, in accordance with some embodiments of the disclosure.

As shown in FIGS. 3A and 4A in accordance with some embodiments, after forming the power rail 116, an isolation structure 218 fills the space between the bottom portion of the fin structures 108 and covers the top surface of the power rail 116. The processes of forming the isolation structure 218 are the same as, or similar to, those used to form the second spacer 118 described in the previous embodiments. For the purpose of brevity, the descriptions of these processes are not repeated herein. In some embodiments, the first spacer 110 and the isolation structure 218 are made of the same material. Therefore, the first spacer 110 and the isolation structure 218 may be etched at the same time in the following process, and the production time and cost may be reduced. In some embodiments, the first spacer 110 and the isolation structure 218 are made of different materials. Therefore, the sidewalls of the first spacer 110 may not be etched in the following etching process due to their different etching selectivity.

In some embodiments, the thickness WS of the first spacer 110 is in a range from about 5 nm to about 20 nm. Moreover, the ratio of the width WS of the first spacer 110 to the width WPR of the power rail 116 is in a range from about 10% to about 100%. If the ratio is too great, the power rail 116 may be too narrow that there may not enough landing area for subsequently formed contact structures. If the ratio is too low, the first spacer 110 may be so narrow that there is not enough isolation between the fin structures 108 and the power rail 116.

Figure 3B:
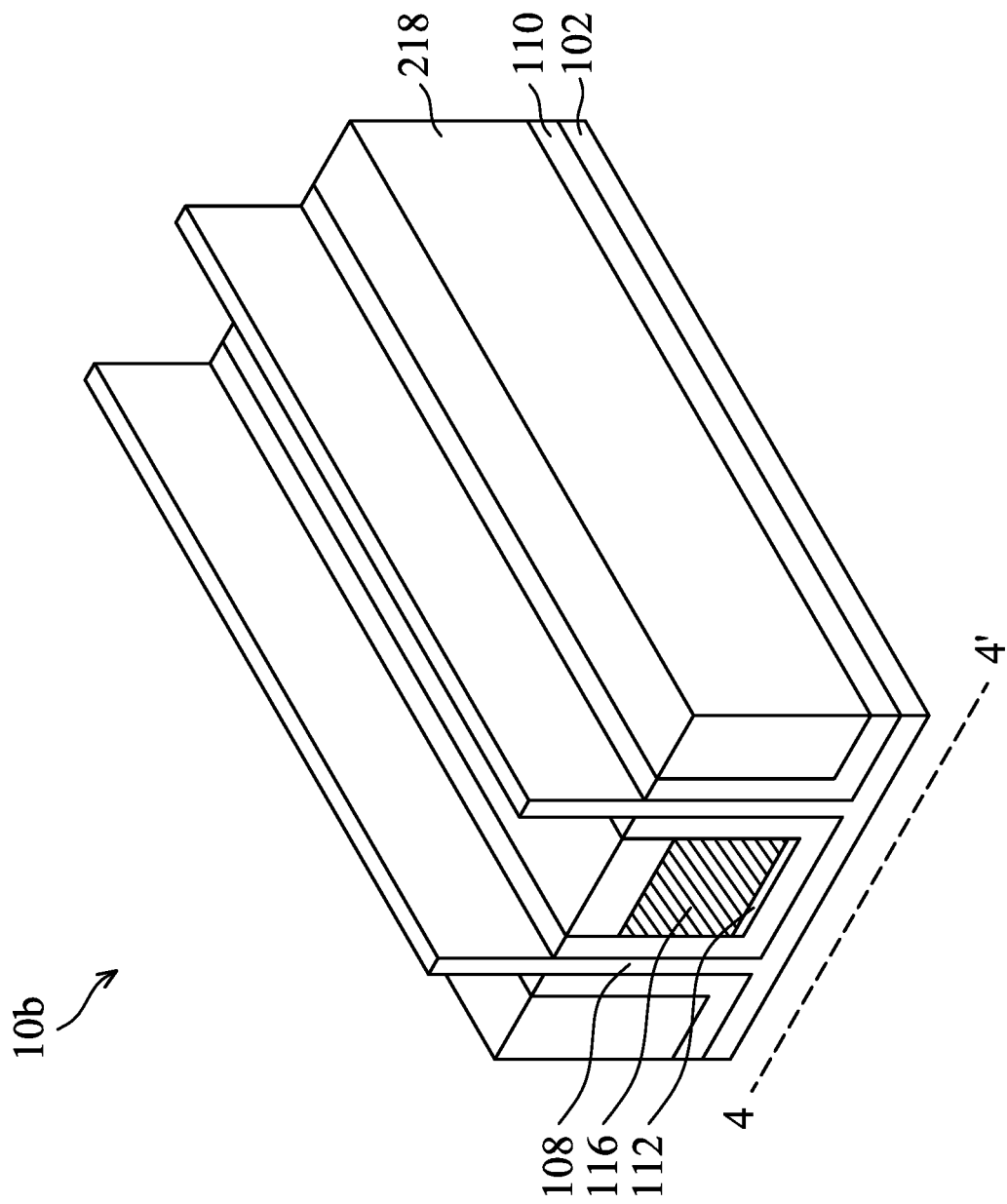
Figure 3C:
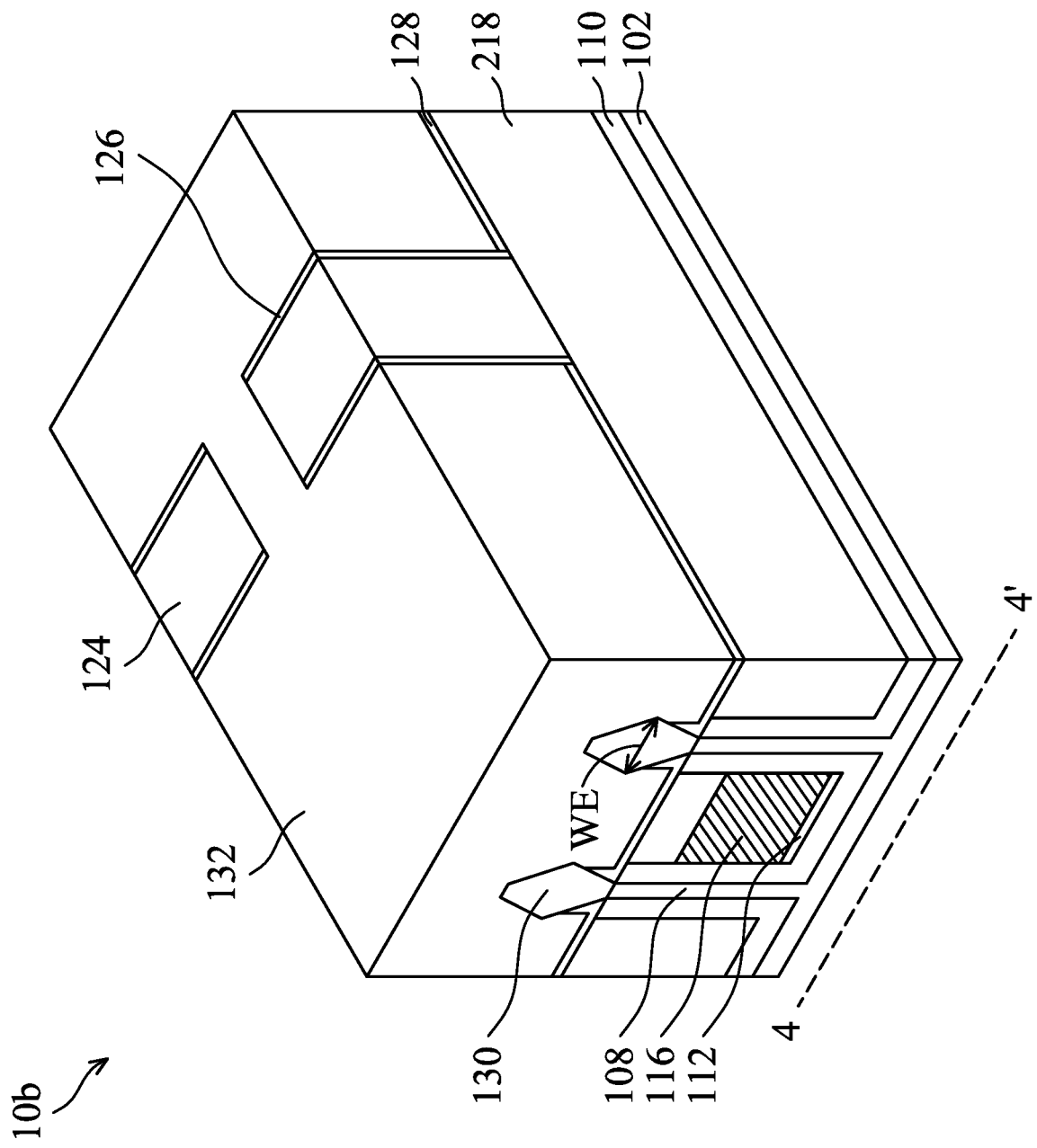
Figure 3D:
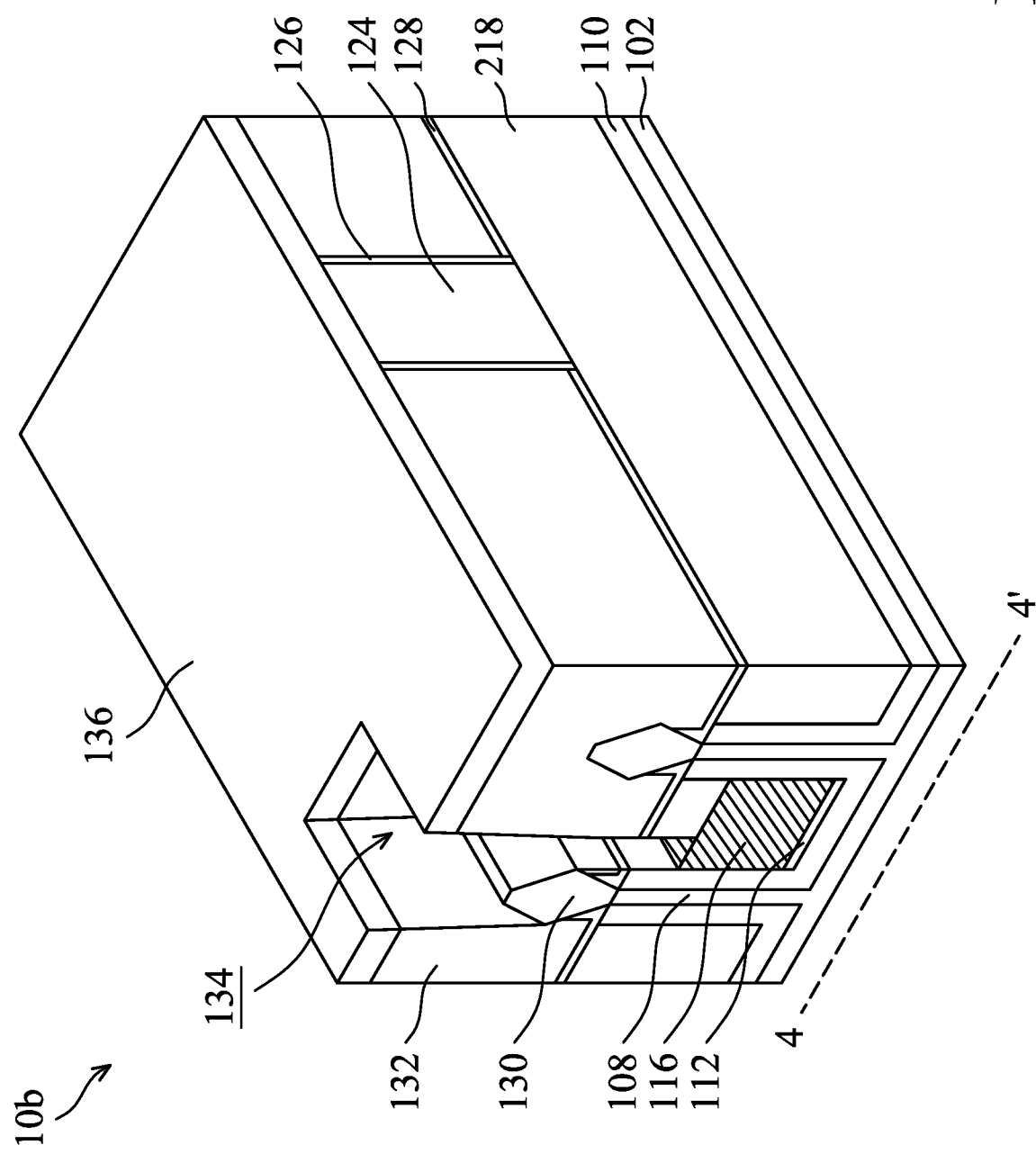
Figure 3E:
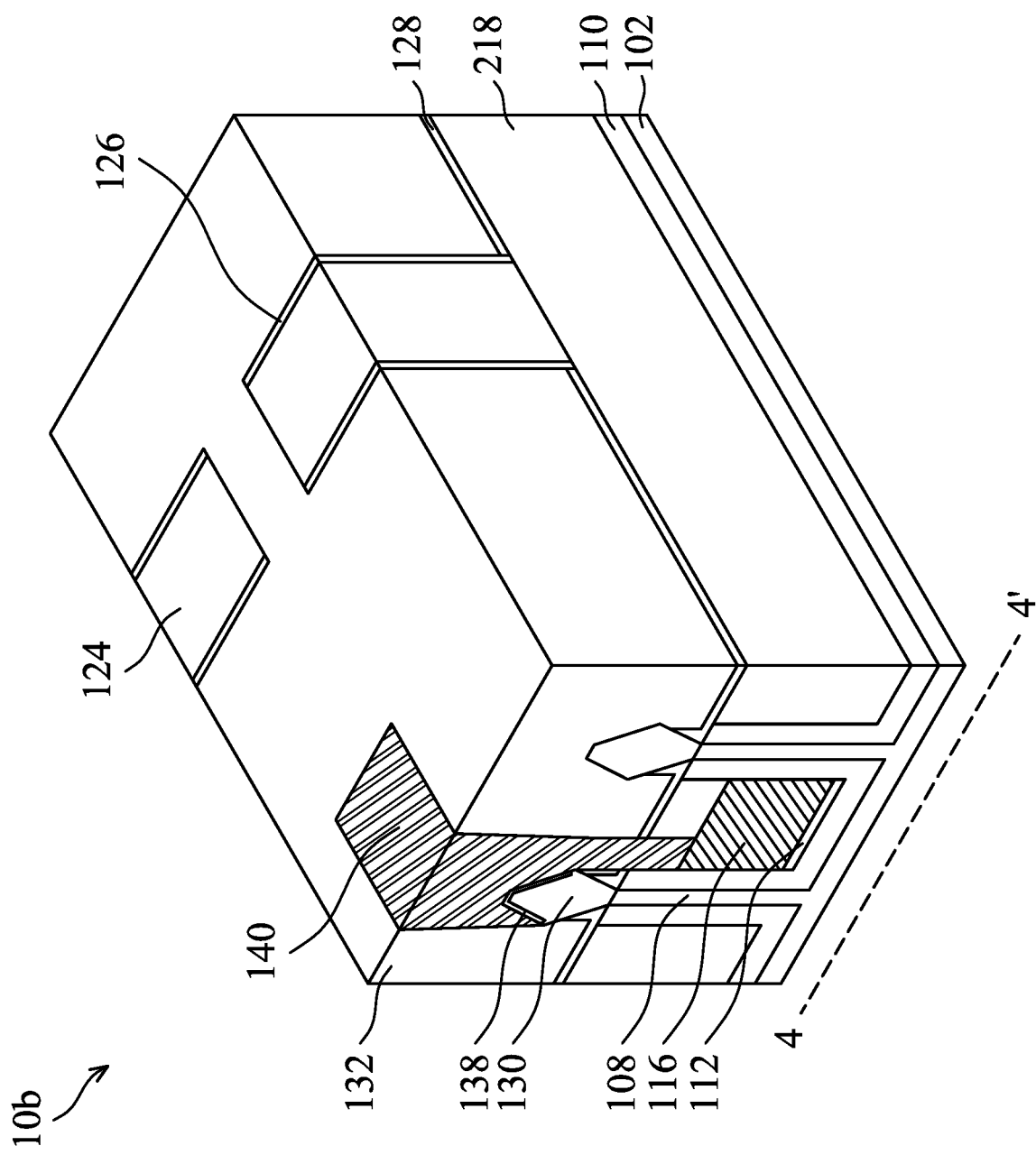
Figure 3F:
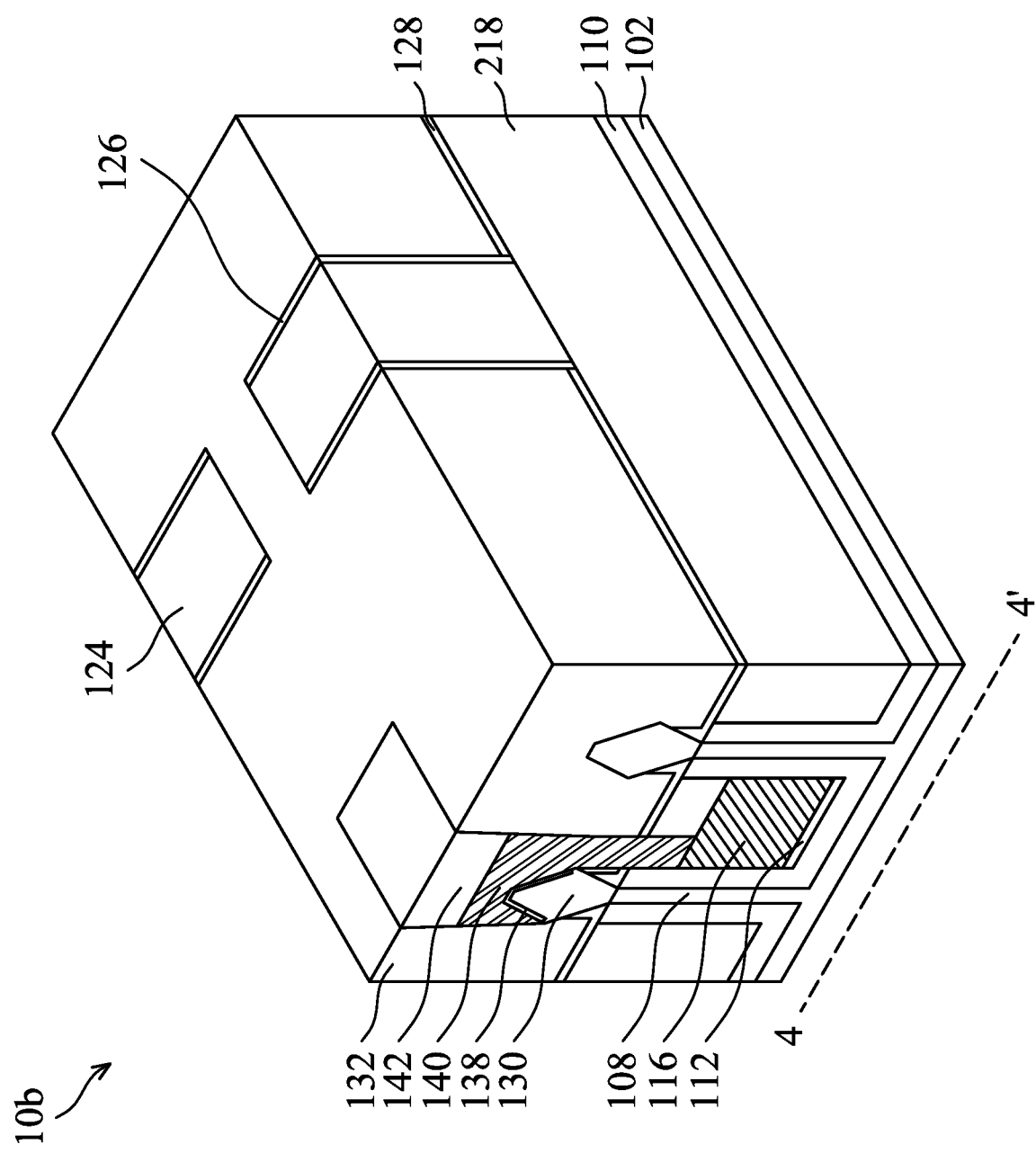
Figure 3G:
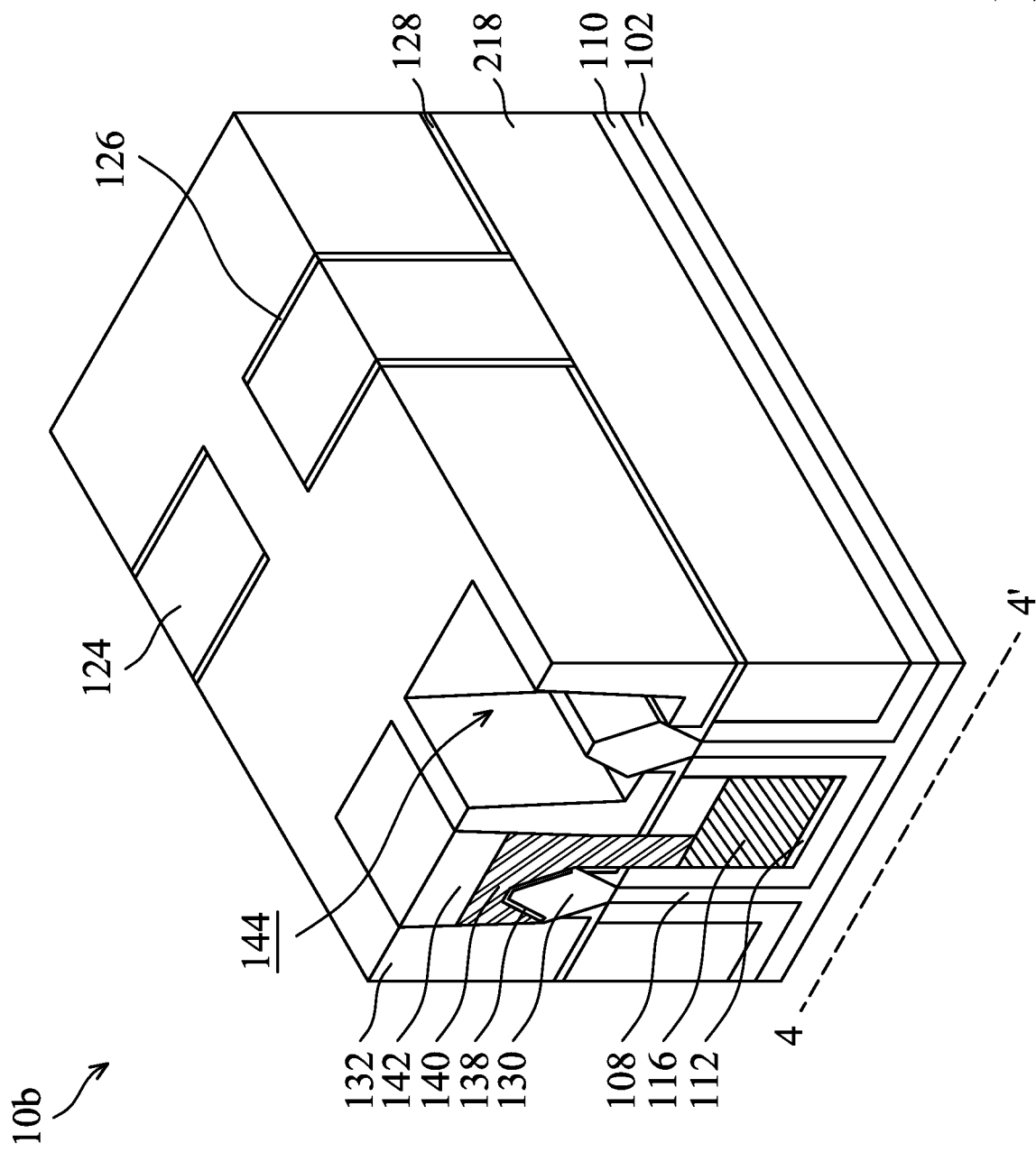
Figure 3H:
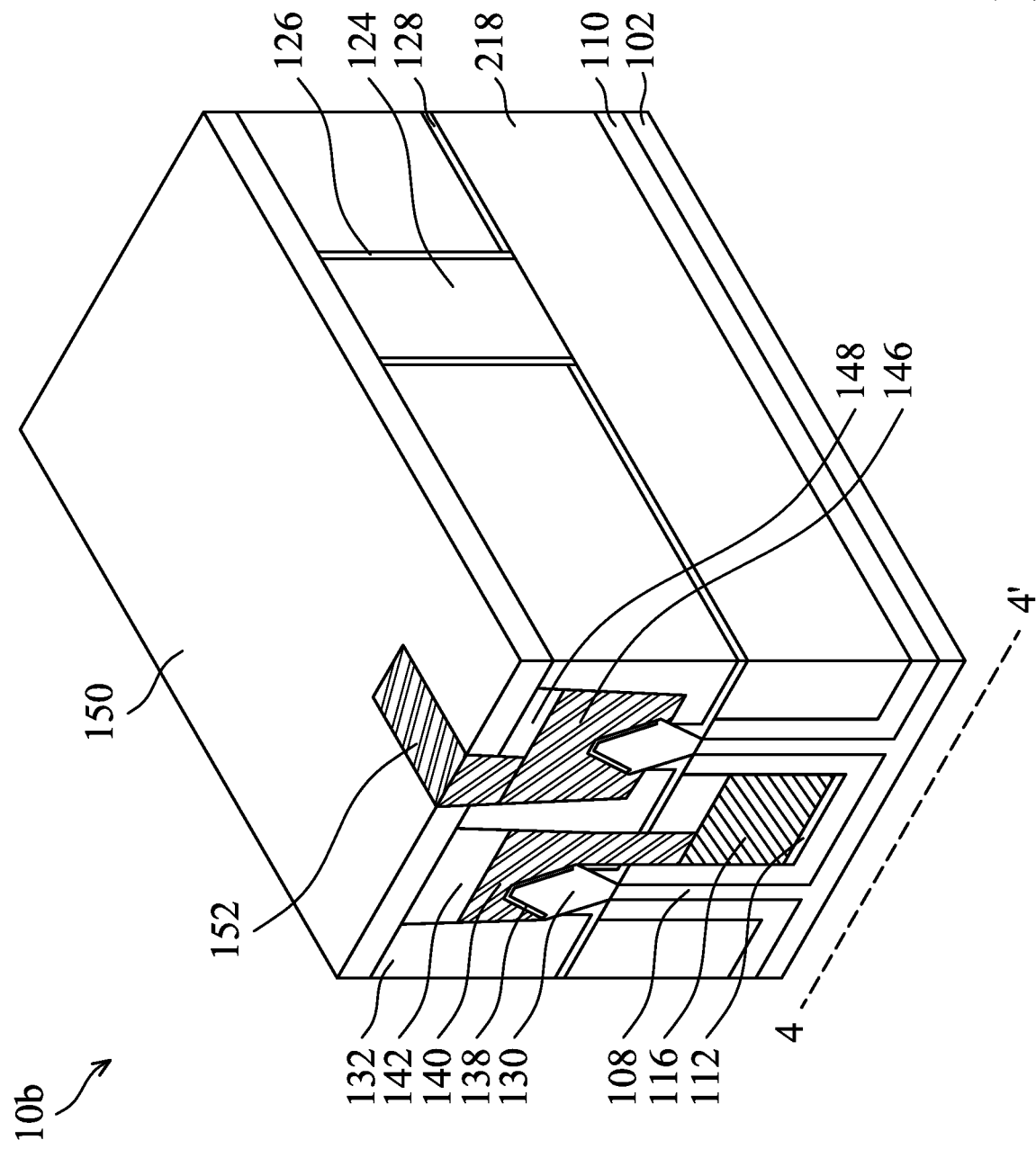
Figure 4B:
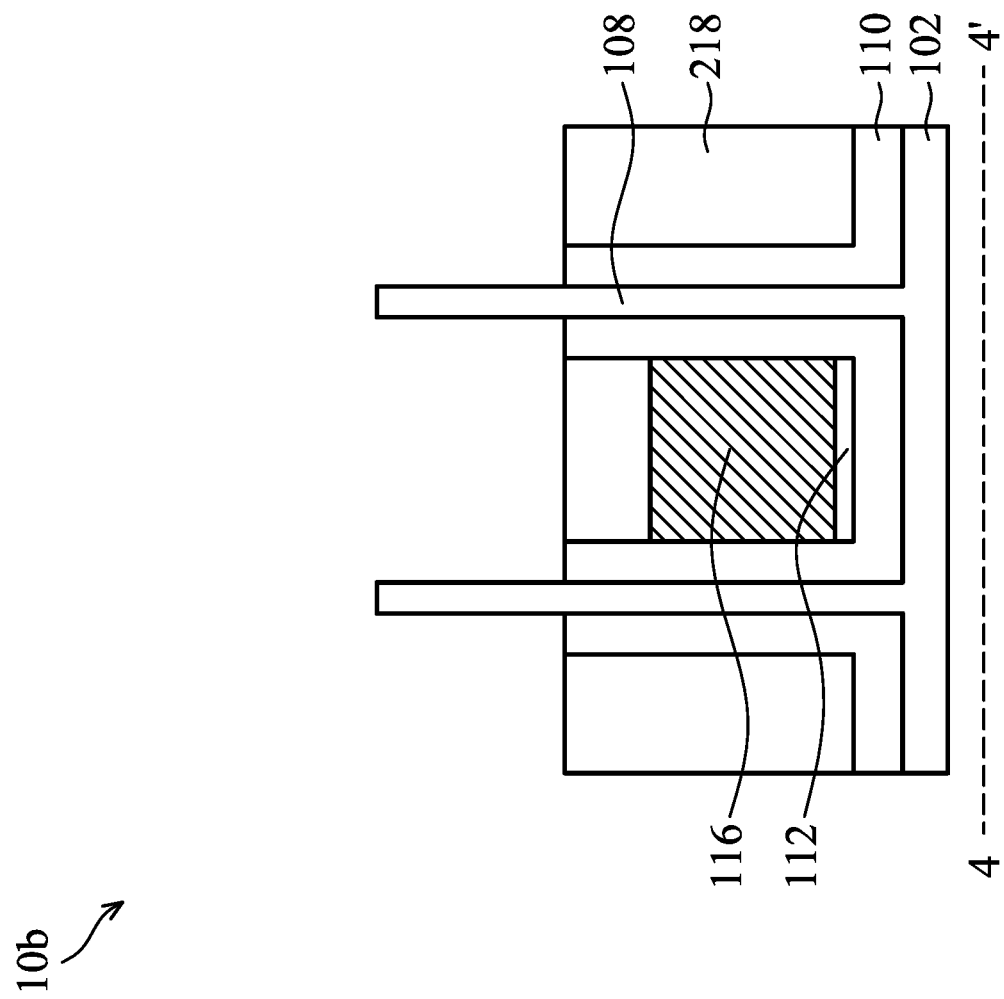
Figure 4C:
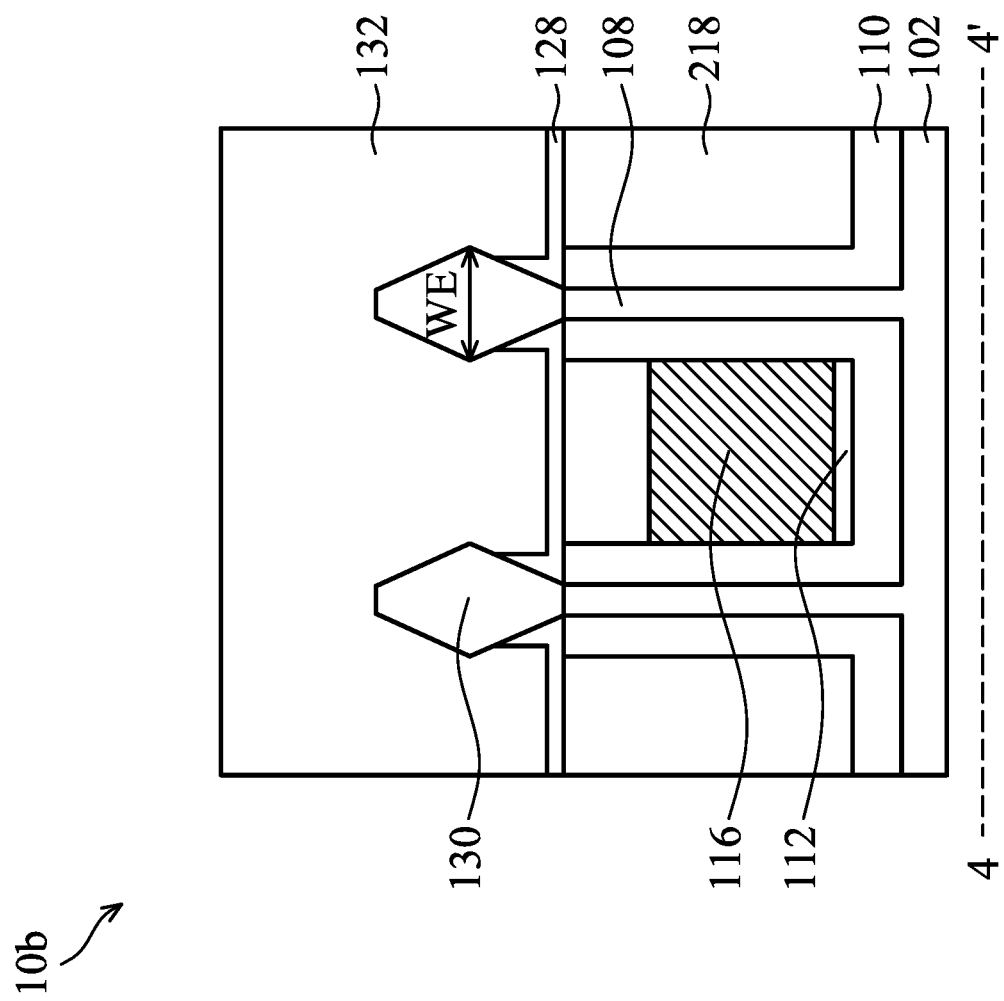
Figure 4D:
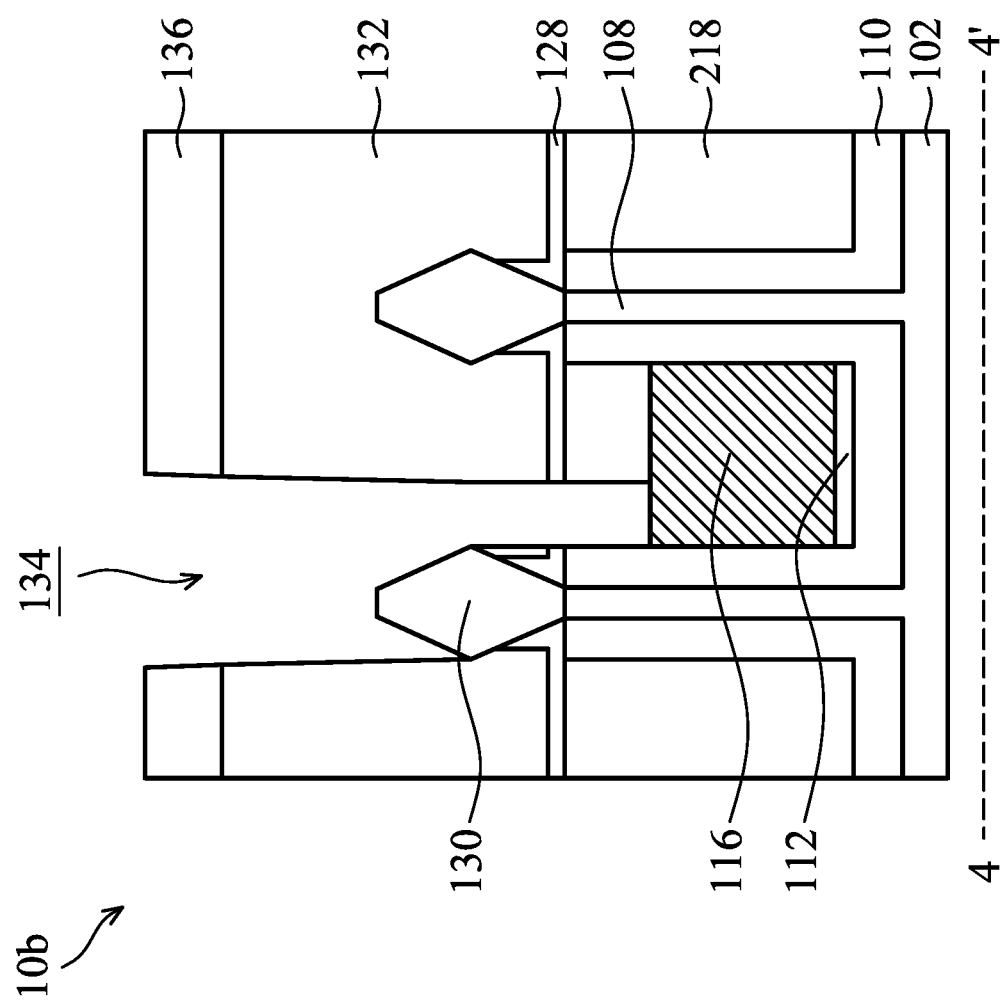
Figure 4E:
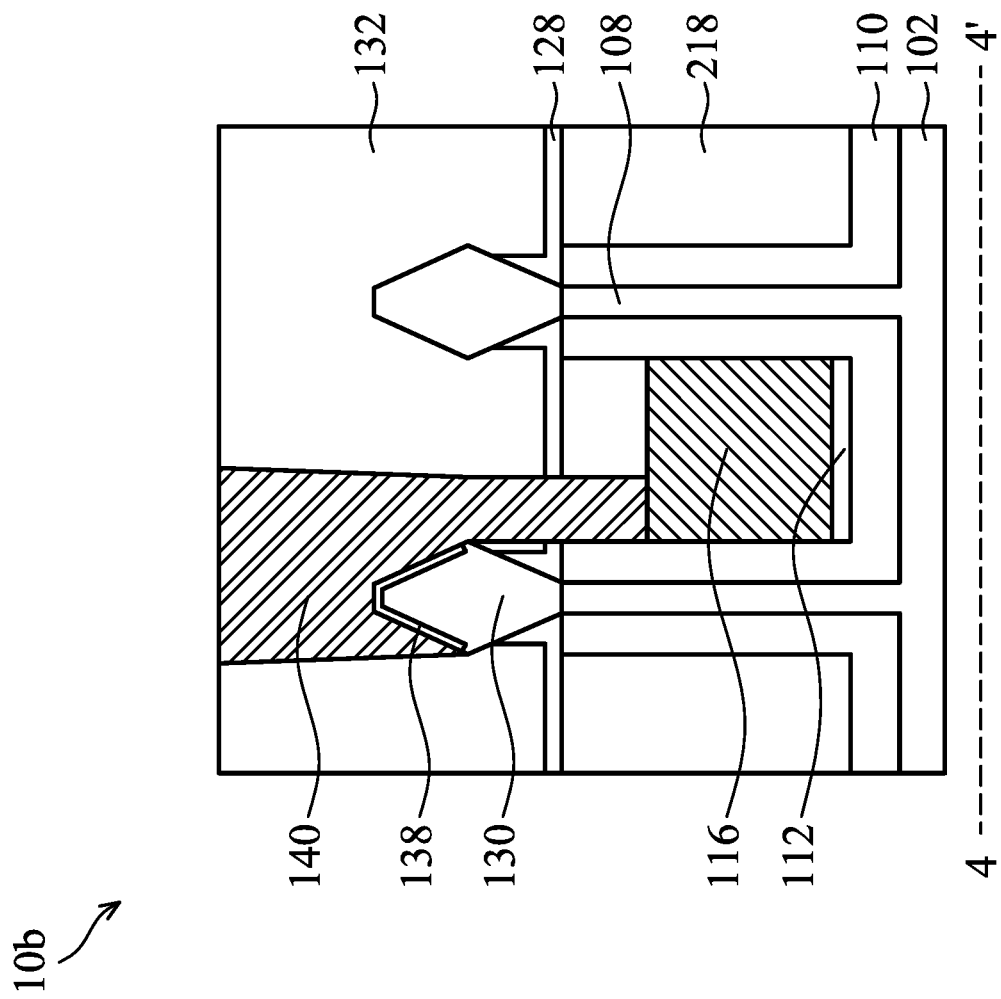
Figure 4F:
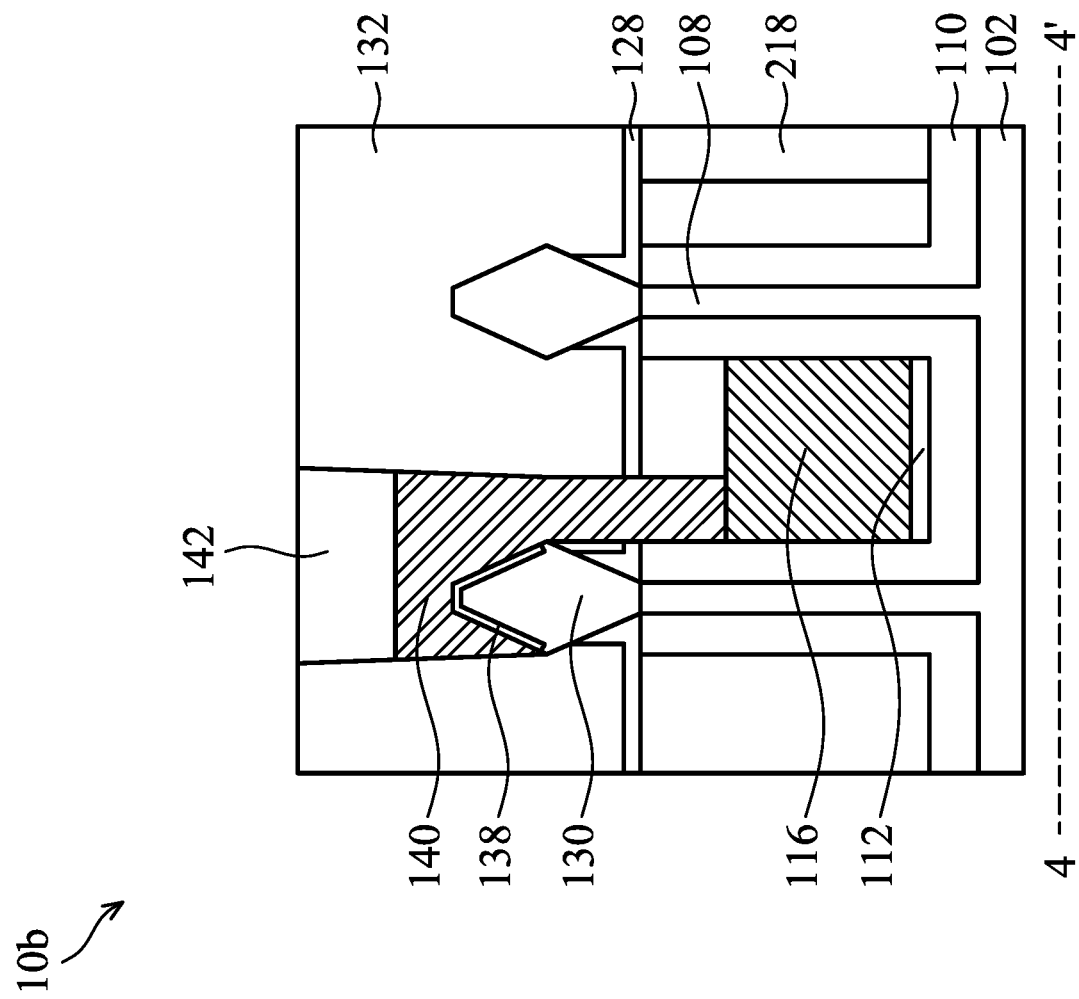
Figure 4G:
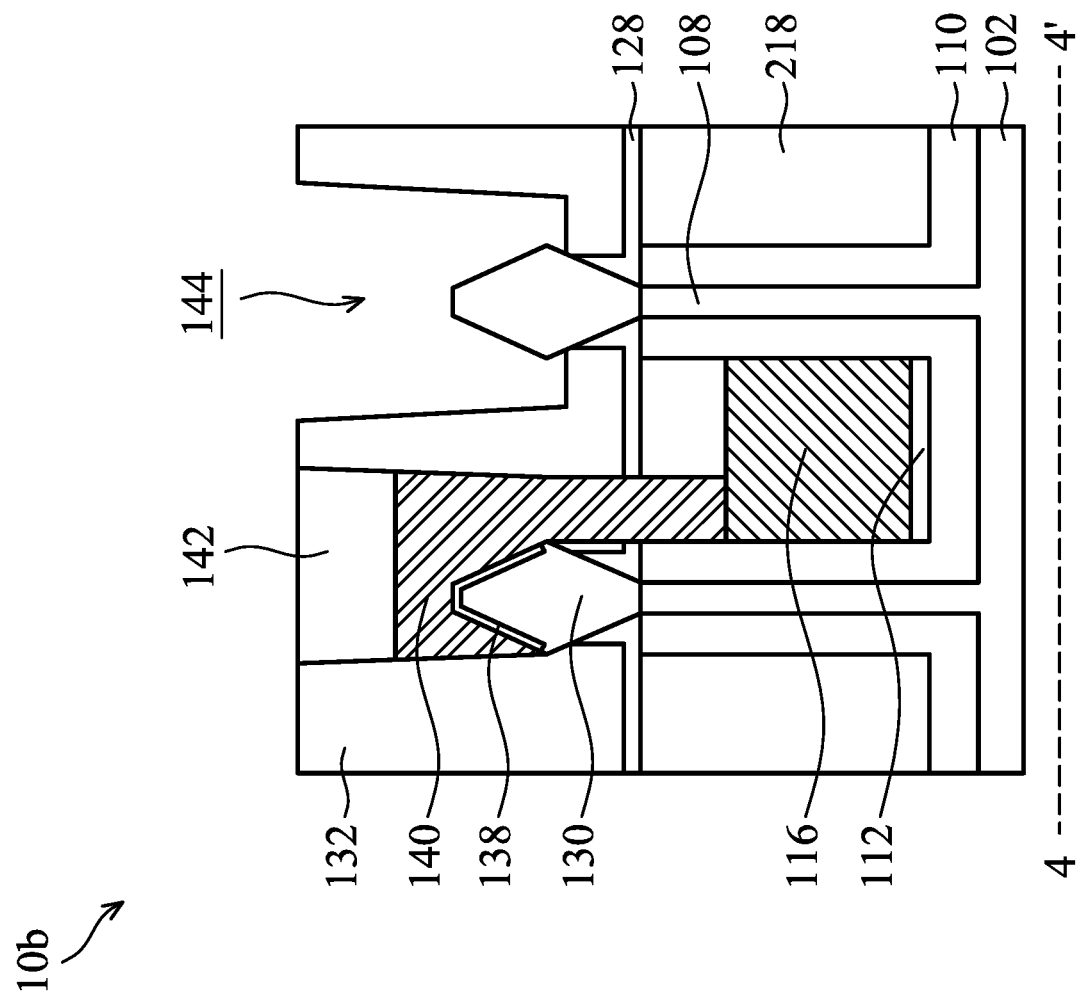
Figure 4H:
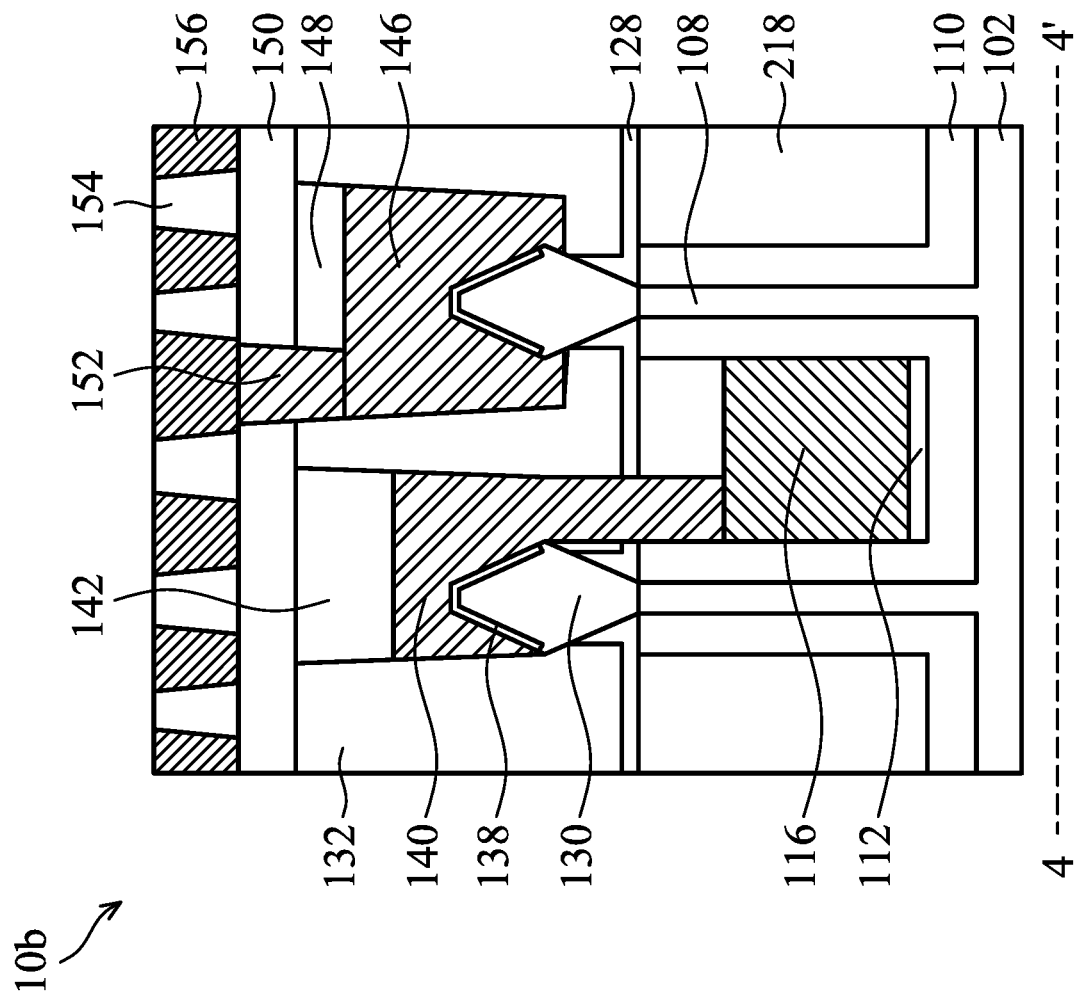

As shown in FIGS. 3B and 4B in accordance with some embodiments, since the isolation structure 218 fills the space between the fin structures 108 and covers the power rail 116, there is no fin isolation structure formed between the fin structures 108 and over the power rail 116. Therefore, as shown in FIGS. 3C and 4C in accordance with some embodiments, the fin spacer 128 is only formed over the fin structures 108.

As shown in FIGS. 3D-3H and 4D-4H in accordance with some embodiments, since there is no fin isolation structures formed between the fin structures 108, the position and the width of the first contact structure 140 may not be confined by the fin isolation structures and there may be more flexibility for forming the first contact structure 140. The position and width of the first contact structure 140 may be determined by the space between the first contact structure 140 and the second contact structure 146. The distance between the first contact structure 140 and the second contact structure 146 is in a range from about 8 nm to about 20 nm. If the distance is too short, the first contact structure 140 and the second contact structure 146 may short-circuit. If the distance is too far, there may not be enough of a landing area for the first contact structure 140 and the second contact structure 146.

With thinner first spacer 110 formed over the fin structures 108, the power rail 116 between the fin structures 108 under the epitaxial structures 130 may have a greater width, offering a larger landing area of the first contact structure 140. Moreover, the reduced epitaxial structure width WE may also offer more room for larger landing area of the first contact structure 140. Therefore, the resistance of the first contact structure 140 may be reduced, and the performance may be improved. The isolation structure 218 surrounds the base portion of the fin structures 108, therefore the position and the width of the first contact structure 140 may not be confined.

Many variations and/or modifications may be made to the embodiments of the disclosure. FIGS. 5A-5D are perspective representations of various stages of forming a modified FinFET device structure 10c, in accordance with some other embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the openings 134 and 144 are formed at the same time.

Figure 5A:
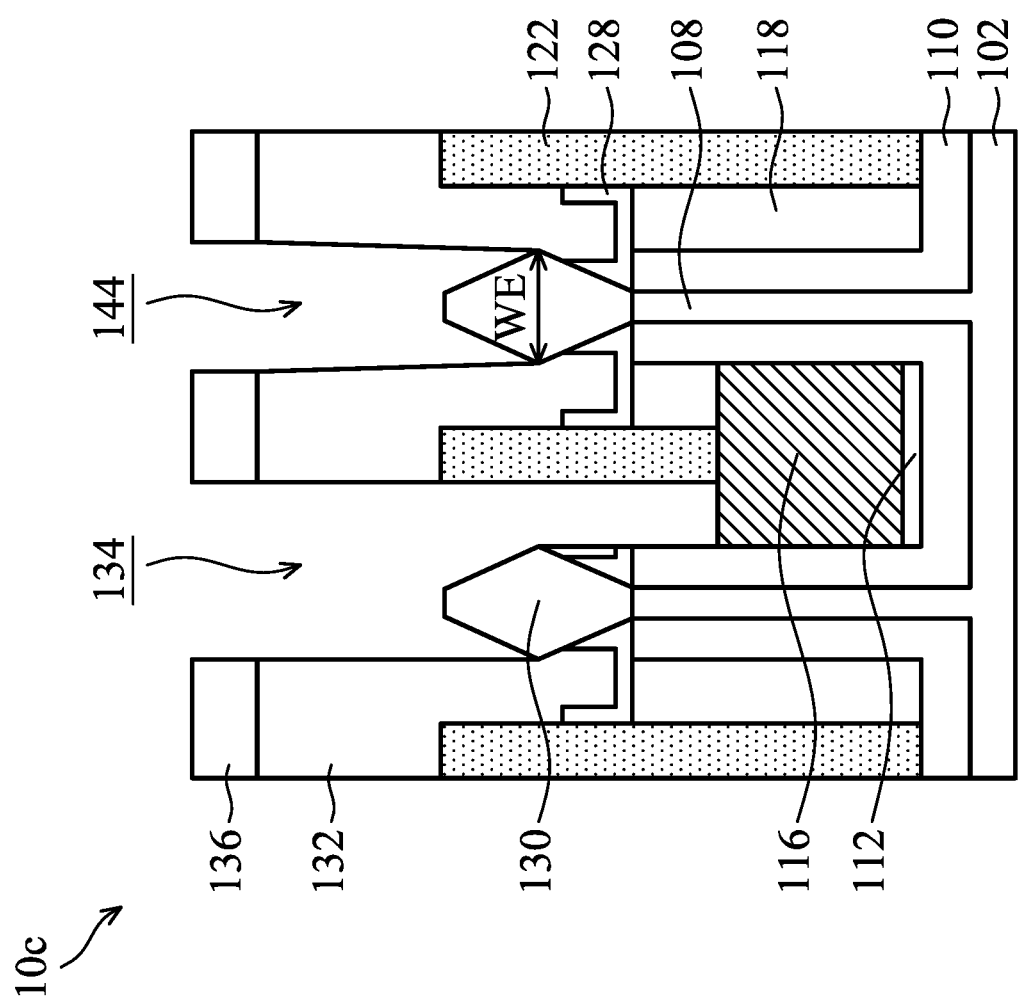
FIGS. 5A-5D are cross-sectional representations of various stages of forming a modified FinFET device structure, in accordance with some other embodiments of the disclosure.
Figure 5B:
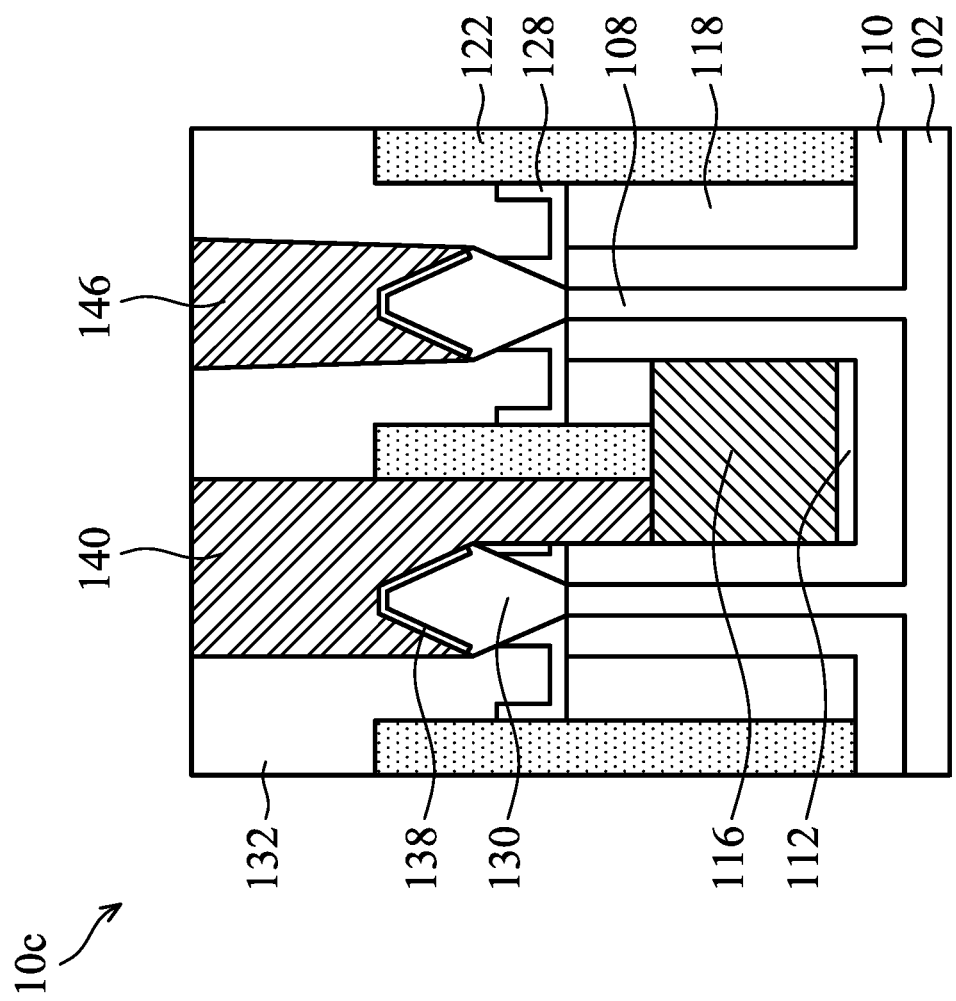
Figure 5C:
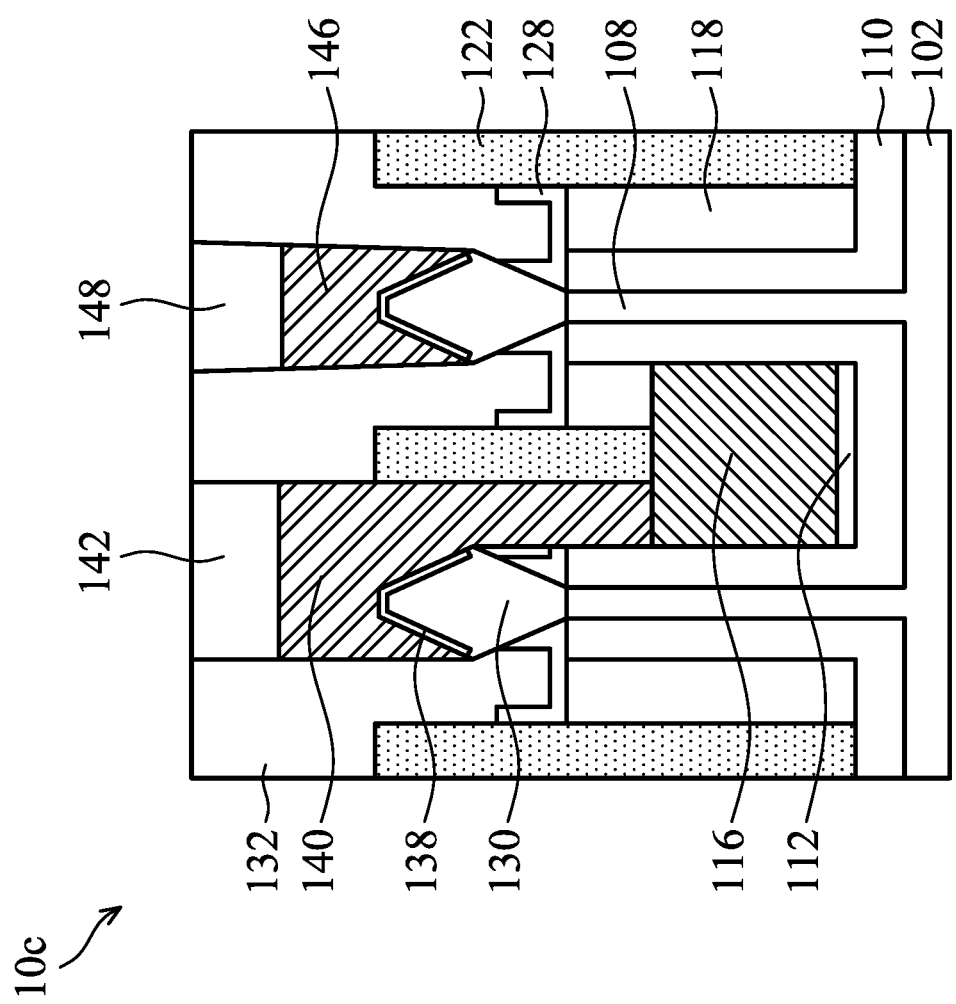
Figure 5D:
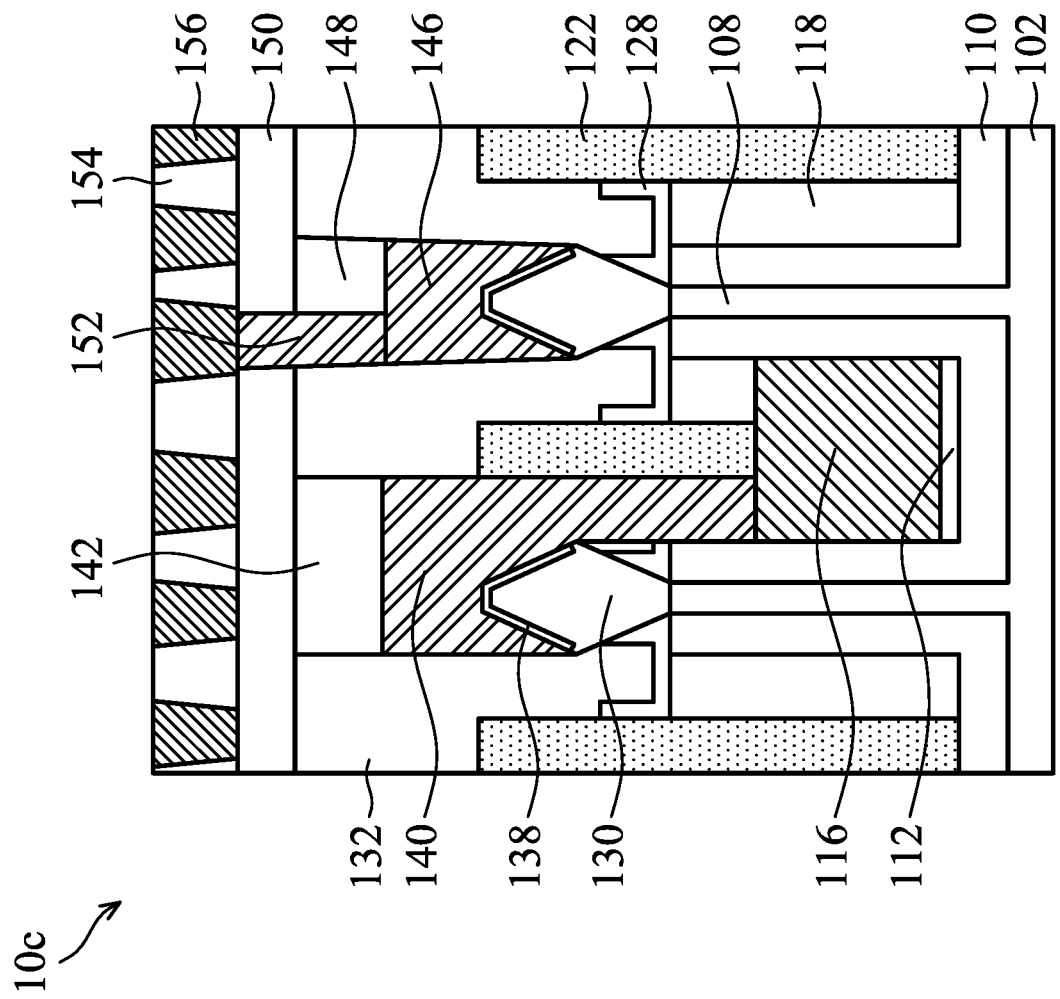

As shown in FIGS. 5B-5D in accordance with some embodiments, the semiconductor compound layers 138 over the epitaxial structures 130 are formed at the same time before forming the first contact structure 140 and the second contact structure 146. In some embodiments, the first contact structure 140 and the second contact structure 146 are also formed at the same time. Since the openings 134 and 144 are formed by the same etching process, the second contact structure 146 may have a narrower width than the width of the first contact structure 140. Therefore, the first contact structure 140 may be in direct contact with the epitaxial structure 130 and the power rail 116, and the second contact structure 146 may be in direct contact only with the epitaxial structure 130.

Moreover, as shown in FIG. 5C in accordance with some embodiments, the first cap layer 142 and the second cap layer 148 are optionally formed at the same time. Therefore, the first cap layer 142 and the second cap layer 148 have the same thickness.

In some embodiments, the distance between the first contact structure 140 and the second contact structure 146 is in a range from about 5 nm to about 20 nm, as shown in FIG. 5B-5D in accordance with some embodiments. If the distance is too short, it may be difficult to form the first contact structure 140 and the second contact structure 146 at the same time. If the distance is too far, there may not be enough of a landing area for the first contact structure 140 and the second contact structure 146.

With double spacers including the first spacer 110 and the second spacer 118 covering the sidewalls of the fin structures 108, the power rail 116 between the fin structures 108 under the epitaxial structures 130 may have a greater width, offering a larger landing area of the first contact structure 140. Moreover, the reduced epitaxial structure width WE may also offer more room for larger landing area of the first contact structure 140. Therefore, the resistance of the first contact structure 140 may be reduced, and the performance may be improved. By forming the first contact structure 140 and the second contact structure 146 at the same time by the same processes, saving time and money in the production process.

As described previously, the power rail 116 between the fin structures 108 under the epitaxial structures 130 may have a greater width due to double spacer structure (110/ 118) or thinner first spacer 110 formed over the sidewalls of the fin structures 108. The epitaxial structure 130 on the fin structures 108 may also have a smaller size. The landing area of the first contact structure 140 may be enlarged and the contact resistance may be reduced. In some embodiments as shown in FIGS. 5A-5D, the contact structures 140/146 are formed at the same time and therefore the production time and cost may be reduced.

Embodiments of a FinFET device structure and a method for forming the same are provided. The method for forming the FinFET device structure may include forming a thinner spacer between the fin structure and the power rail between the bottom portion of the fin structures. A single contact structure may be formed over the fin structure and the power rail. The landing area of the contact structure over the power rail may be enlarged and the contact resistance may be reduced. The area of the chip may be further reduced and the chip speed may be gained.

In some embodiments, a method for forming a FinFET device structure is provided. The method for forming a FinFET device structure includes forming a first fin structure and a second fin structure on a substrate. The method for forming a FinFET device structure also includes depositing a first spacer layer over the first fin structure and the second fin structure. The method for forming a FinFET device structure also includes growing a power rail between the bottom portion of the first fin structure and the bottom portion of the second fin structure. The method for forming a FinFET device structure also includes forming a second spacer layer over the sidewalls of the first spacer layer and over the top surface of the power rail. The method for forming a FinFET device structure also includes forming a first fin isolation structure over the power rail between the first fin structure and the second fin structure. The method for forming a FinFET device structure also includes forming a first contact structure over the first fin structure and a portion of the power rail. The method for forming a FinFET device structure also includes forming a second contact structure over the second fin structure.

In some embodiments, a method for forming a FinFET device structure is provided. The method for forming a FinFET device structure includes forming a first fin structure and a second fin structure on a substrate. The method for forming a FinFET device structure also includes depositing a spacer layer over the first fin structure and the second fin structure. The method for forming a FinFET device structure also includes growing a power rail over the substrate between the first fin structure and the second fin structure. The method for forming a FinFET device structure also includes filling an isolation structure surrounding a base portion of the first fin structure and a base portion of the second fin structure and covering the power rail. The method for forming a FinFET device structure also includes forming a first contact structure over the first fin structure and a portion of the power rail. The method for forming a FinFET device structure also includes forming a second contact structure over the second fin structure. The ratio of the width of the spacer to the width of the power rail is in a range from about 10% to about 100%.

In some embodiments, a FinFET device structure is provided. The FinFET device structure includes a first fin structure and a second fin structure formed on a substrate. The FinFET device structure also includes a first spacer layer formed over the first fin structure and the second fin structure. The FinFET device structure also includes a power rail formed over the substrate between the bottom portion of the first fin structure and the bottom portion of the second fin structure. The FinFET device structure also includes a first contact structure formed over the first fin structure and a portion of the power rail. The FinFET device structure also includes a second contact structure formed over the second fin structure. The ratio of the width of the first spacer to the width of the power rail is in a range from about 10% to about 100%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor device structure, comprising:
    forming a first fin structure and a second fin structure on a substrate;
    depositing a first spacer layer over the first fin structure and the second fin structure;
    growing a power rail between a bottom portion of the first fin structure and a bottom portion of the second fin structure;
    forming a second spacer layer over the sidewalls of the first spacer layer and over a top surface of the power rail;
    forming a first fin isolation structure over the power rail between the first fin structure and the second fin structure;
    forming a first contact structure over the first fin structure and a portion of the power rail; and
    forming a second contact structure over the second fin structure.

2. The method for forming the fin field effect transistor device structure as claimed in claim 1, further comprising:
    forming a seed layer over the substrate between the first fin structure and the second fin structure before growing the power rail.

3. The method for forming the fin field effect transistor device structure as claimed in claim 1, wherein a sidewall of the first contact structure is aligned with a sidewall of the first fin isolation structure.

4. The method for forming the fin field effect transistor device structure as claimed in claim 1, further comprising:
    forming a second fin isolation structure on an opposite side of the first fin structure and the second fin structure relative to the first fin isolation structure,
    wherein a spacing difference between a space between the first fin structure and the first fin isolation structure and a space between the first fin structure and the second fin isolation structure is in a range from about 0.5% to about 5%.

5. The method for forming the fin field effect transistor device structure as claimed in claim 1, further comprising:
    removing a top portion of the first contact structure and forming a first cap layer over the first contact structure; and
    removing a top portion of the second contact structure and forming a second cap layer over the second contact structure,
    wherein the first cap layer and the second cap layer have different thicknesses.

6. The method for forming the fin field effect transistor device structure as claimed in claim 1, wherein the first contact structure and the second contact structure are formed at the same time.

7. The method for forming the fin field effect transistor device structure as claimed in claim 6, wherein the second contact structure has a narrower width than the first contact structure.

8. A method for forming a fin field effect transistor device structure, comprising: forming a first fin structure and a second fin structure on a substrate; depositing a spacer layer over the first fin structure and the second fin structure; growing a power rail over the substrate between the first fin structure and the second fin structure; filling an isolation structure surrounding a base portion of the first fin structure and a base portion of the second fin structure and covering the power rail; forming a first contact structure over the first fin structure and a portion of the power rail; and forming a second contact structure over the second fin structure, wherein a ratio of a width of the spacer layer to a width of the power rail is in a range from about 10% to about 100%.

9. The method for forming the fin field effect transistor device structure as claimed in claim 8, wherein the spacer layer and the isolation structure are made of different materials.

10. The method for forming the fin field effect transistor device structure as claimed in claim 8, further comprising:
    forming a fin spacer over the first fin structure and the second fin structure.

11. The method for forming the fin field effect transistor device structure as claimed in claim 8, further comprising:
    forming an epitaxial structure at a top portion of the first fin structure and the second fin structure; and
    forming a silicide layer over the epitaxial structure over the first fin structure and over the epitaxial structure over the second fin structure respectively.

12. The method for forming the fin field effect transistor device structure as claimed in claim 8, further comprising:
    forming a silicide layer over a top portion of the first fin structure and the second fin structure at the same time before forming the first contact structure.

13. The method for forming the fin field effect transistor device structure as claimed in claim 8, further comprising:
    forming a third contact structure over the second contact structure,
    wherein a projection area of the third contact structure on the substrate is less than a projection area of the second contact structure on the substrate.

14. A fin field effect transistor device structure, comprising: a first fin structure and a second fin structure formed on a substrate; a first spacer layer surrounding the first fin structure and the second fin structure; a power rail formed over the substrate between a bottom portion of the first fin structure and a bottom portion of the second fin structure; a first contact structure formed over the first fin structure and in contact with a portion of the power rail; and a second contact structure formed over the second fin structure, wherein a ratio of a width of the first spacer layer to a width of the power rail is in a range from about 10% to about 100%.

15. The fin field effect transistor device structure as claimed in claim 14, further comprising:
a seed layer formed over the substrate between the first fin structure and the second fin structure,
wherein the power rail is formed over the seed layer.

16. The fin field effect transistor device structure as claimed in claim 14, further comprising:
a second spacer layer formed on the sidewalls of the first spacer layer and over the power rail; and
a fin isolation structure formed between the adjacent second spacer layers and protruding from a top surface of the power rail.

17. The fin field effect transistor device structure as claimed in claim 16, wherein the first spacer layer and the second spacer layer are made of a same material.

18. The fin field effect transistor device structure as claimed in claim 16, wherein the first spacer layer and the fin isolation structure are made of different materials.

19. The fin field effect transistor device structure as claimed in claim 14, further comprising:
an isolation structure filled into a space between the bottom portion of the first fin structure and the bottom portion of the second fin structure and covering a top surface of the power rail.

20. The fin field effect transistor device structure as claimed in claim 19, wherein the isolation structure and the first spacer layer are made of a same material.

* * * * *